(12) United States Patent
Kawahito et al.

(10) Patent No.: US 7,612,700 B2
(45) Date of Patent: Nov. 3, 2009

(54) PIPELINE TYPE A/D CONVERTER APPARATUS PROVIDED WITH PRECHARGE CIRCUIT FOR PRECHARGING SAMPLING CAPACITOR

(75) Inventors: Shoji Kawahito, Shizuoka (JP); Kazutaka Honda, Shizuoka (JP); Yasuhide Shimizu, Nagasaki (JP); Kuniyuki Tani, Gifu (JP); Akira Kurauchi, Kanagawa (JP); Koji Sushihara, Nara (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 12/139,754

(22) Filed: Jun. 16, 2008

(65) Prior Publication Data

US 2009/0146854 A1 Jun. 11, 2009

(30) Foreign Application Priority Data

Dec. 10, 2007 (JP) .............................. 2007-318466

(51) Int. Cl.
*H03M 1/38* (2006.01)
(52) U.S. Cl. ..................... 341/161; 341/162; 341/172
(58) Field of Classification Search ................. 341/161, 341/162, 172
See application file for complete search history.

(56) References Cited

U.S. PATENT DOCUMENTS

| | | | |
|---|---|---|---|
| 6,756,928 B2 | 6/2004 | Kawahito et al. | |
| 6,839,015 B1 * | 1/2005 | Sutardja et al. | 341/161 |
| 6,967,610 B1 * | 11/2005 | Sutardja et al. | 341/161 |
| 7,304,598 B1 * | 12/2007 | Bogner et al. | 341/161 |
| 7,429,946 B2 * | 9/2008 | Huang | 341/172 |
| 7,450,050 B2 * | 11/2008 | Rezayee et al. | 341/161 |

FOREIGN PATENT DOCUMENTS

JP 2003-158434 5/2003

OTHER PUBLICATIONS

K. Iizuka et al., "A 14-bit Digitally Self-Calibrated Pipelined ADC with Adaptive Bias Optimization for Arbitrary Speeds Up to 40 MS/s", IEEE Journal of Solid-State Circuits, vol. 41, pp. 883-890, Apr. 2006.

(Continued)

*Primary Examiner*—Khai M Nguyen
(74) *Attorney, Agent, or Firm*—Wenderoth, Lind & Ponack, L.L.P.

(57) ABSTRACT

In a pipeline type A/D converter apparatus including A/D converter circuit parts connected in cascade with each other and A/D converting a sample hold signal in a pipeline form, each A/D converter circuit part includes a pre-A/D converter circuit for A/D converting an input signal into a digital signal, and a multiplying D/A converter circuit for D/A converting the digital signal into an analog control signal, and D/A converting the input signal by sampling, holding and amplifying the input signal using a sampling capacitor based on the analog control signal. A precharge circuit precharges a sampling capacitor before sampling so as to attain a predetermined output value in accordance with a digital input to output characteristic substantially adapted to an input to output characteristic of each A/D converter circuit part that presents an output signal corresponding to the input signal to each A/D converter circuit part.

8 Claims, 29 Drawing Sheets

OTHER PUBLICATIONS

B. Murmann et al., "A 12-bit 75-MS/s Pipelined ADC Using Open-Loop Residue Amplification", IEEE Journal of Solid-State Circuits, vol. 38, pp. 2040-2050, No. 12, Dec. 2003.

S. Kawahito et al., "Low-Power Design of High-Speed A/D Converters", IEICE Transactions on Electronics, vol. E88-C, No. 4, pp. 468-478, Apr. 2005.

D. Kelly et al., "A 3V 340mW 14b 75MSPS CMOS ADC with 85dB SFDR at Nyquist", ISSCC Digest of Technical Papers, pp. 134-135, Feb. 2001.

H. C. Liu et al., "A 15b 20MS/s CMOS Pipelined ADC with Digital Background Calibration", ISSCC Digest of Technical Papers, pp. 374-375, Feb. 2004.

H. Matsui et al., "A 14bit Digitally Self-Calibrated Pipelined ADC with Adaptive Bias Optimization for Arbitrary Speeds up to 40MS/s", IEEE Symposium on VLSI Circuits, pp. 330-333, Jun. 2005.

P. Bogner et al., "A 14b 100MS/s Digitally Self-Calibrated Pipelined ADC in 0.13 µm CMOS", ISSCC Digest of Technical Papers, pp. 224-225, Feb. 2006.

\* cited by examiner

A/D CONVERTER CIRCUIT PART ADa(k)

Fig.14

| VOLTAGE RANGE OF INPUT VOLTAGE Vin | RA | RB | RC |
|---|---|---|---|
| INPUT VOLTAGE Vin | $-Vr$ | $-\frac{Vr}{4}$ | $\frac{Vr}{4}$  $Vr$ |
| D00 | 0 | 1 | 1 |
| D01 | 0 | 0 | 1 |
| VP | 0 | 0 | 1 |
| VZ | 0 | 1 | 0 |
| VM | 1 | 0 | 0 |
| OUTPUT VOLTAGE FROM DAC 62 | $-Vr$ | 0 | $+Vr$ |

Fig.16

| VOLTAGE RANGE OF INPUT VOLTAGE Vin | RP | RQ | RR | RS | RT | RU | RV |
|---|---|---|---|---|---|---|---|
| INPUT VOLTAGE Vin | −Vr | −3Vr/4 | −Vr/2 | −Vr/4 | Vr/4 | Vr/2 | 3Vr/4 ~ Vr |
| D00 | 0 | 0 | 0 | 1 | 1 | 1 | 1 |
| D01 | 0 | 0 | 0 | 0 | 1 | 1 | 1 |
| D10 | 0 | 0 | 1 | 1 | 1 | 1 | 1 |
| D11 | 0 | 0 | 0 | 0 | 0 | 1 | 1 |
| D20 | 0 | 1 | 1 | 1 | 1 | 0 | 1 |
| D21 | 0 | 0 | 0 | 0 | 0 | 0 | 1 |
| VP | 0 | 0 | 1 | 1 | 0 | 0 | 1 |
| VZ | 0 | 1 | 0 | 0 | 1 | 0 | 0 |
| VM | 1 | 0 | 0 | 0 | 0 | 0 | 0 |
| OUTPUT VOLTAGE FROM PCDAC 62a | −Vr | 0 | Vr | 0 | −Vr | 0 | Vr |

Fig.17 FIRST PREFERRED EMBODIMENT

Fig.22

SUMMARY OF PERFORMANCE

| PROCESS TECHNOLOGY | 0.25 μm CMOS 5M1P |
|---|---|
| SUPPLY VOLTAGE | AVDD=3.0V, DVDD=2.5/3.3V |
| SIGNAL SWING | 3.0Vpp |
| QUANTIZATION BIT RATE (RESOLUTION) | 14 BITS |
| SAMPLING RATE | 30 MSamples/sec |
| MAXIMUM DNL | −0.3LSB/+0.3LSB |
| MINIMUM INL | −2.0LSB/+2.5LSB |
| SNDR(Fin=10MHz) | 70.7dB |
| SFDR(Fin=10MHz) | 82.8dB |
| TOTAL POWER CONSUMPTION | 102mW |
| ACTIVE AREA | 2.0mm × 4.0mm |

Fig.23

| PROCESS TECHNOLOGY (μm) | $V_{DD}$ (V) | Fs (MHz) | POWER (mW) | SNDR (dB) | FOM (pJ/com) | DISCLOSED DOCUMENT |
|---|---|---|---|---|---|---|
| 0.35 | 3.0 | 75 | 340 | 73 | 1.22 | NON-PATENT DOCUMENT 4 |
| 0.25 | 3.3 | 40 | 370 | 73.5 | 2.31 | NON-PATENT DOCUMENT 5 |
| 0.18 | 2.8 | 30 | 50.5 | 68.6 | 0.72 | NON-PATENT DOCUMENT 6 |
| 0.13 | 1.5 | 100 | 224 | 67.5 | 1.12 | NON-PATENT DOCUMENT 7 |
| 0.25 | 3.0 | 30 | 102 | 70.7 | 1.17 | PREFERRED EMBODIMENT |

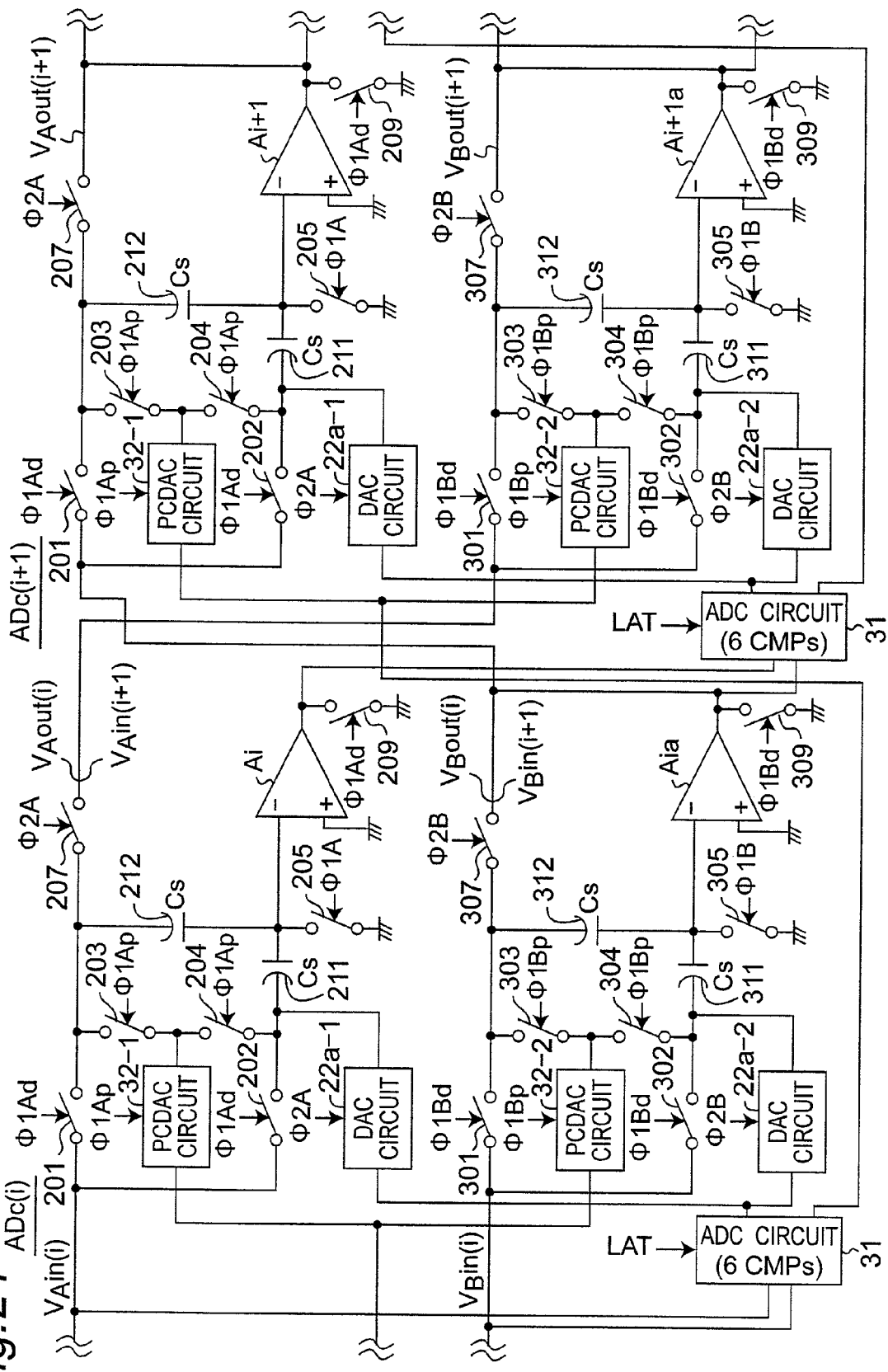
Fig. 24 SECOND PREFERRED EMBODIMENT

Fig.28 FOURTH PREFERRED EMBODIMENT

PIPELINE TYPE A/D CONVERTER APPARATUS PROVIDED WITH PRECHARGE CIRCUIT FOR PRECHARGING SAMPLING CAPACITOR

BACKGROUND OF THE INVENTION

1. Field of the Invention

The present invention relates to a pipeline type A/D converter apparatus configured by, for example, VLSI, and provided with a precharge circuit.

2. Description of the Related Art

Under present circumstances where analog-digital consolidation system LSIs play great roles in accordance with developments in the communication and video technologies, a reduction in the power consumption of consolidation system LSIs is a matter of major concern. The progresses in the semiconductor fine processing technology have caused increases in the performance and integration of digital circuits and achieved efficient power reductions with lowered power voltages. On the other hand, A/D converters of analog circuits, which have become easily increased in speed by virtue of improvements in the basic performances of transistors, still need to cope with device variations on processes, deteriorations in the signal-to-noise ratio (hereinafter referred to as SNR) due to lowered voltages and so on, and this leads to difficulties in the circuit design for obtaining reliable performances.

In general, high-resolution pipeline type A/D converters need a large sampling capacitance to secure a high SNR, and it is unavoidable to increase the power consumption of an amplifier for charge and discharge of the capacitance. Nevertheless, the pipeline architecture is put to practical use as an A/D converter that can achieve high speed and high resolution with low power consumption as compared with the other conversion systems.

A prior art pipeline type A/D converter apparatus will be described below. The pipeline A/D converter apparatus configured by including a multistage cascade connection of low-resolution A/D converters is the architecture that can achieve high speed and high resolution with a comparatively low power consumption as compared with the A/D converter apparatuses of the other systems, and the architecture serve as the mainstream in the speed range of sampling frequencies of several megahertz to several hundreds of megahertz with a resolution of 8 to 14 bits.

FIG. 3 is a block diagram showing a configuration of a prior art A/D converter circuit part ADa(k). Referring to FIG. 3, the circuit part is constituted of a pre-A/D converter circuit (hereinafter referred to as an ADC circuit) 21a and a multiplication type D/A converter circuit (hereinafter referred to as an MDAC (Multiplying Digital to Analog Converter) circuit) 26 of the so-called basic arithmetic circuit. In this case, the MDAC circuit 26 is constituted of a D/A converter circuit (hereinafter referred to as a DAC circuit) 22a, four switches SW1 to SW4, sampling capacitances C1 and C2 and an operational amplifier A1.

The circuit part is constituted of a pipeline stage of a MDAC circuit 26, which is the basic computing circuit that receives an analog input signal by a sample holding circuit, subsequently doubles the input voltage and performs subtraction and addition of a reference voltage, and a sub-A/D converter circuit 21a of a comparator. Each stage operates in a pipeline manner by alternately repeating a "sampling mode" and an "amplification mode" and delivering operation results every half clock to the subsequent stages from the input to the final stage. The resolution is determined depending on a resolution per stage and the number of stages of the pipeline.

A high-resolution pipeline A/D converter apparatus needs large signal amplitude for securing the SNR (Signal to Noise Ratio) and large sampling capacitances C1 and C2 for suppressing thermal noises generated from the operational amplifier A1 and switches SW1 to SW4. The power consumption of the pipeline A/D converter apparatus is dominated by a bias current of the operational amplifier A1 used in the sample holding circuit of the input part and the following pipeline stages. In order to perform sampling at high speed for a large capacitance value, it is necessary to increase the bias current to perform quick charge and discharge, and an increase in the power consumption is a concern.

FIG. 4 is a block diagram showing operations of prior art A/D converter circuit parts ADa(i) and ADa(i+1). FIG. 4 shows an operation of general 1.5 bits/stage pipeline A/D converter circuit parts ADa(i) and ADa(i+1). When the i-th stage is set in the sampling mode, the two sampling capacitances C1 and C2 sample an input voltage Vin. Subsequently, in the amplification mode, the bottom electrode of the sampling capacitance C1 is connected to the reference voltage of the D/A converter, and the bottom electrode of the sampling capacitance C2 is connected to an output voltage terminal (Vout) according to the judgment result of the ADC circuit 21a of the comparator. An output voltage at this time is transferred to the next stage that is set in the sampling mode. In the redundant binary 1.5 bits/stage system, the output signal from the ADC circuit 21a of the comparator is encoded into a digital value of $Di \in \{-1, 0, 1\}$, and the input to output characteristics of the pipeline stage can be expressed by the following Equations:

$$Vout = 2Vin - Vr \quad \text{for } Di = 1; \quad (1)$$
$$= 2Vin \quad \text{for } Di = 0;$$
$$= 2Vin + Vr \quad \text{for } Di = -1,$$

where Vin denotes an input signal voltage of the pipeline stage, Vout denotes an output signal voltage of the pipeline stage, and Vr denotes a reference voltage of A/D conversion. In terms of the circuit structure, the sampling capacitances C1 and C2 of the next stage need to be charged to a predetermined value with the output voltage of the operational amplifier A1 at the moment of phase switchover from the "sampling mode" to the "amplification mode". Since the inputted signal is subjected to sequential operation at the pipeline stage, the charging time changes depending on the initial charge charged in the sampling capacitances C1 and C2 of the next stage, and this influences on the settling response. In particular, when the Nyquist frequency that is half the frequency of the sampling frequency becomes an input frequency, the settling becomes slowest due to the influence of charges directly opposite to the voltage to be sampled stored in the next capacitance. The maximum settling time limits the sampling rate of the A/D converter apparatus.

The prior art documents related to the present invention are as follows:

(a) Patent document 1: Japanese patent laid-open publication No. 2003-158434;

(b) Non-patent document 1: K. Iizuka et al., "A 14-bit digitally self-calibrated pipelined ADC with adaptive bias optimization for arbitrary speeds up to 40 MS/s", IEEE J. Solid-State Circuits, Vol. 41, pp. 883-890, April 2006;

(c) Non-patent document 2: B. Murman et al., "A 12-bit 75-MS/s pipelined ADC using open-loop residue amplifier", IEEE Journal on Solid-State Circuits, Vol. 38, pp. 2040-2050, December 2003;

(d) Non-patent document 3: S. Kawahito et al., "Low-Power Design of High-Speed A/D Converters", IEICE Transactions on Electronics, Vol. E88-C, No. 4, pp. 468-478, April 2005;

(e) Non-patent document 4: D. Kelly et al., "A 3V 340 mW 14 b 75MSPS CMOS ADC with 85SFDR at Nyquist", ISSCC Digest of Technical Papers, pp. 134-135, February 2001;

(f) Non-patent document 5: H. C. Liu et al., "A 15 b 20 MS/s CMOS Pipelined ADC with Digital Background Calibration", ISSCC Digest of Technical Papers, pp. 374-375, February 2004;

(g) Non-patent document 6: H. Matsui et al., "A 14-bit digitally self-calibrated pipelined ADC with Adaptive Bias Optimization for Arbitrary Speeds up to 40 MS/s", IEEE Symposium on VLSI Circuits, pp. 330-333, June 2005; and (h) Non-patent document 7: P. Bogner et al., "A 14 b 100 MS/s Digitally Self-Calibrated Pipelined ADC in 0.13 μm CMOS", ISSCC Digest of Technical Papers, pp. 224-225, February 2006.

A method for further reducing the power consumption of the high-resolution pipeline A/D converter is reported on the research level, whereas there is very few reports that has achieved a sufficient performance at high speed and with low power consumption (See, for example, Non-Patent Documents 1 and 2).

The pipeline type A/D converter of the first prior art configured by the multistage cascade connection of low-resolution A/D converters is known as an architecture that can achieve high speed and high resolution with a lower power consumption than that of the other A/D converters (See, for example, Patent Document 1). In the pipeline type A/D converter, the resolution is determined by the resolution per stage and the number of pipeline stages, and the stages alternately repeat the "sampling mode" and the "amplification mode". A high-resolution pipeline A/D converter needs large signal amplitude for obtaining a high SNR and a large sampling capacitance for suppressing thermal noises generated from the amplifier and the switches. The power consumption of the A/D converter is determined by the sample holding (S/H) circuit of the input part and the bias current of the operational amplifier used at the pipeline stage following the circuit. In order to sample a large capacitance value at higher speed, it is necessary to increase the bias current to quickly perform charge and discharge, and an increase in the power consumption becomes a concern.

Moreover, sharing of an amplifier (amplifier sharing) can be enumerated as one method for power reduction. In the pipeline A/D converter, the amplifier is used only half time with respect to the clock frequency. The sharing is intended to reduce the power consumption by preparing another set of sampling capacitances at the pipeline stage and efficiently using the amplifier by switchover of switches. The amplifier sharing with the interleave configuration (lateral 2-channel system) of the second prior art, in which the other capacitance set enters the amplification mode while one capacitance set performs sampling in a certain pipeline stage, is able to approximately halve the operation frequency of the amplifier itself without changing the overall operation frequency. If the operation frequency of the amplifier becomes slow, the power consumption can easily be reduced since the bias current is allowed to be small (See, for example, Non-Patent Document 3 in which a lateral amplifier sharing type interleave system pipeline type A/D converter is disclosed).

The pipeline A/D converter of the first prior art adopts a method of scaling the sampling capacitance employed at the pipeline stage for lower power consumption. This is intended to reduce power supply to the subsequent stages by reducing in steps the sampling capacitance of the factor related to the accuracy and noises since the pipeline A/D converters suffer less influence of noises and less influence on the speed as they are located in hind stages. However, since the capacitance scaling is the technique generally put into practice, a more effective reduction is demanded.

Moreover, the pipeline type A/D converter of the second prior art needs a reset interval for erasing the sample history that might influence the settling response in the input of the amplifier and for common-mode feedback of the amplifier, and it is difficult to actually reduce the power by half.

SUMMARY OF THE INVENTION

An object of the present invention is to solve the above problems and provide a pipeline type A/D converter apparatus capable of remarkably reducing power consumption or increasing the operating speed of the apparatus without increasing the power consumption as compared with the prior art techniques.

According to the present invention, there is provided a pipeline type A/D converter apparatus includes a sample holding circuit for sampling and holding an analog input signal and outputting a sample hold signal, and an A/D converter device including a plurality of A/D converter circuit parts connected in cascade with each other. The A/D converter device A/D converts the sample hold signal in a pipeline form. Each of the A/D converter circuit parts includes a pre-A/D converter circuit including a plurality of comparators, and a multiplying D/A converter circuit. The pre-A/D converter circuit A/D converts the input signal into a digital signal. The multiplying D/A converter circuit D/A converts the digital signal from the pre-A/D converter circuit into an analog control signal, and D/A converts the input signal by sampling, holding and amplifying the input signal using a sampling capacitor based on the analog control signal. The pipeline type A/D converter apparatus includes a precharge circuit for precharges the sampling capacitor before sampling so as to attain a predetermined output value in accordance with a digital input to output characteristic substantially adapted to an input to output characteristic of each of the A/D converter circuit part that presents an output signal corresponding to the input signal to each of the A/D converter circuit parts.

In the above-mentioned pipeline type A/D converter apparatus, the pre-A/D converter circuit of each of the A/D converter circuit parts includes six comparators, and a logic circuit. The comparators have threshold values different from each other, and each of the comparators compares the input signal with the threshold value and outputting a comparison result signal. The logic circuit outputs a three-value output signal based on each of the comparison result signals from the six comparators.

In addition, in the above-mentioned pipeline type A/D converter apparatus, the comparators have threshold values of −3Vr/4, −Vr/2, −Vr/4, +Vr/4, +Vr/2 and +3Vr/4, respectively, where Vr denotes an A/D conversion reference value of each of the A/D converter circuit parts. The logic circuit outputs an output signal having three values of −Vr, 0 and +Vr based on the comparison result signals from the six comparators.

Further, in the above-mentioned pipeline type A/D converter apparatus, the pre-A/D converter circuit of each of the A/D converter circuit parts includes fourteen comparators, and a logic circuit. The fourteen comparators has threshold values different from each other, and each of the comparators compares the input signal with the threshold value, and outputs a comparison result signal. The logic circuit outputs a three-value output signal based on each of the comparison result signals from the fourteen comparators.

Furthermore, in the above-mentioned pipeline type A/D converter apparatus, the comparators have threshold values of −7Vr/8, −3Vr/4, −5Vr/8, −Vr/2, −3Vr/8, −Vr/4, −Vr/8, +Vr/8, +Vr/4, +3Vr/8, +Vr/2, +5Vr/8, +3Vr/4 and +7Vr/8, respectively, where Vr denotes an A/D conversion reference value of each of the A/D converter circuit parts. The logic circuit outputs an output signal having three values of −Vr, 0 and +Vr based on the comparison result signals from the fourteen comparators.

Still further, in the above-mentioned pipeline type A/D converter apparatus, each of the A/D converter circuit parts includes the pre-A/D converter circuit, and first and second multiplying D/A converter circuits. The pipeline type A/D converter apparatus further includes a controller for controlling the plurality of A/D converter circuit parts connected in cascade with each other so as to control the first multiplying D/A converter circuit of each of A/D converter circuit parts of odd-number stages to execute processing of precharging, sampling and holding, so as to control the second multiplying D/A converter circuit of each of the A/D converter circuit parts of the odd-number stages to execute amplification processing, so as to control the first multiplying D/A converter circuit of each of A/D converter circuit parts of even-number stages to execute amplification processing, and so as to control the second multiplying D/A converter circuit of each of the A/D converter circuit parts of the even-number stages to execute processing of precharging, sampling and holding.

In this case, in each of the A/D converter circuit parts of the above-mentioned pipeline type A/D converter apparatus, one amplifier is shared by an amplifier for performing amplification processing by the first multiplying D/A converter circuit and an amplifier for performing amplification processing by the second multiplying D/A converter circuit.

Still further, in the above-mentioned pipeline type A/D converter apparatus, the A/D converter device includes a first pipeline A/D converter circuit group including a plurality of A/D converter circuit parts connected in cascade with each other, and a second pipeline A/D converter circuit group including a plurality of A/D converter circuit parts connected in cascade with each other. The A/D converter device A/D converts the sample hold signals of two systems using the first and second pipeline A/D converter circuit groups in a pipeline form.

According to the pipeline type A/D converter apparatus of the present invention, the precharge circuit is provided that precharges the sampling capacitors before sampling so as to attain the predetermined output values in accordance with the digital input to output characteristics substantially adapted to the input to output characteristics of the A/D converter circuit parts that present output signals corresponding to the input signals to the A/D converter circuit parts. Therefore, the pipeline type A/D converter apparatus can be provided which is capable of remarkably reducing the power consumption or increasing the operating speed of the apparatus without increasing the power consumption as compared with the prior art techniques.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 14 is a table showing operations of the logic circuits 61 and 62 and the DAC 62 of FIG. 10, representing signal levels with respect to the voltage ranges of the input voltage Vin and the output voltage of the DAC 62;

FIG. 16 is a table showing operations of the logic circuit 63 and the precharge D/A converter (PCDAC) 62a of FIG. 10, representing signal levels with respect to the voltage range of the input voltage Vin and the output voltage of the PCDAC circuit 62a;

FIG. 22 is a table showing results of experiments conducted by the inventors, representing the summary of the performance of the pipeline A/D converter apparatus of the first preferred embodiment;

FIG. 23 is a table showing results of experiments conducted by the inventors, representing comparison of the performance of the pipeline A/D converter apparatuses of the prior art documents and the first preferred embodiment;

FIG. 24 is a circuit diagram showing a detailed configuration of A/D converter circuit parts ADc(i) and ADc(i+1) according to a second preferred embodiment of the present invention;

DETAILED DESCRIPTION OF THE PREFERRED EMBODIMENTS

Figure 1:
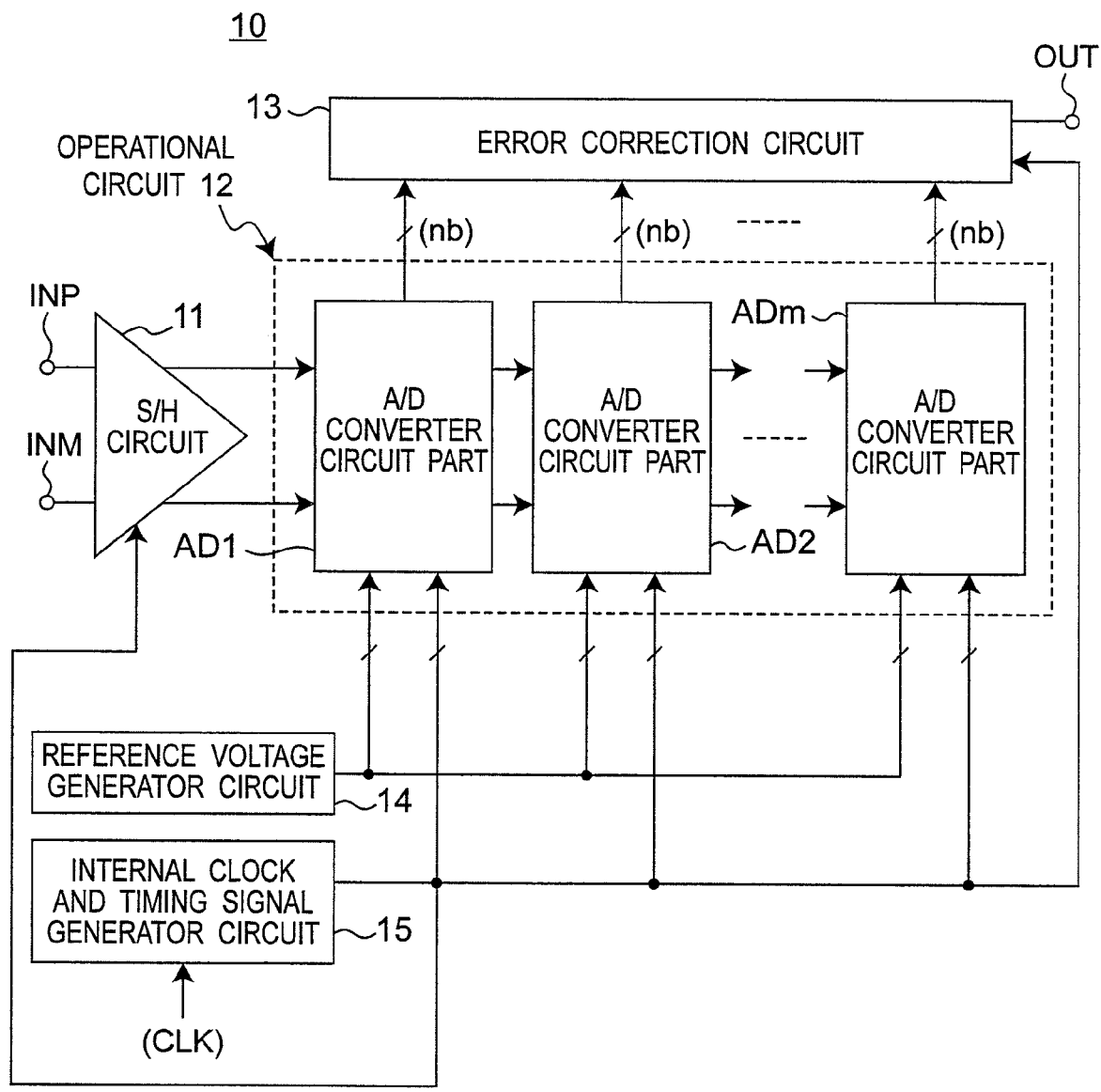
FIG. 1 is a block diagram showing a configuration of a pipeline A/D converter apparatus according to a first preferred embodiment of the present invention.

Novel pipeline A/D converter apparatuses, which use precharge operation for the provision of high-speed high-resolution A/D converter apparatuses with low power consumption, will be described below in the preferred embodiments of the present invention with reference to the drawings. In the following preferred embodiments, like components are denoted by like reference numerals.

First Preferred Embodiment

Figure 2:
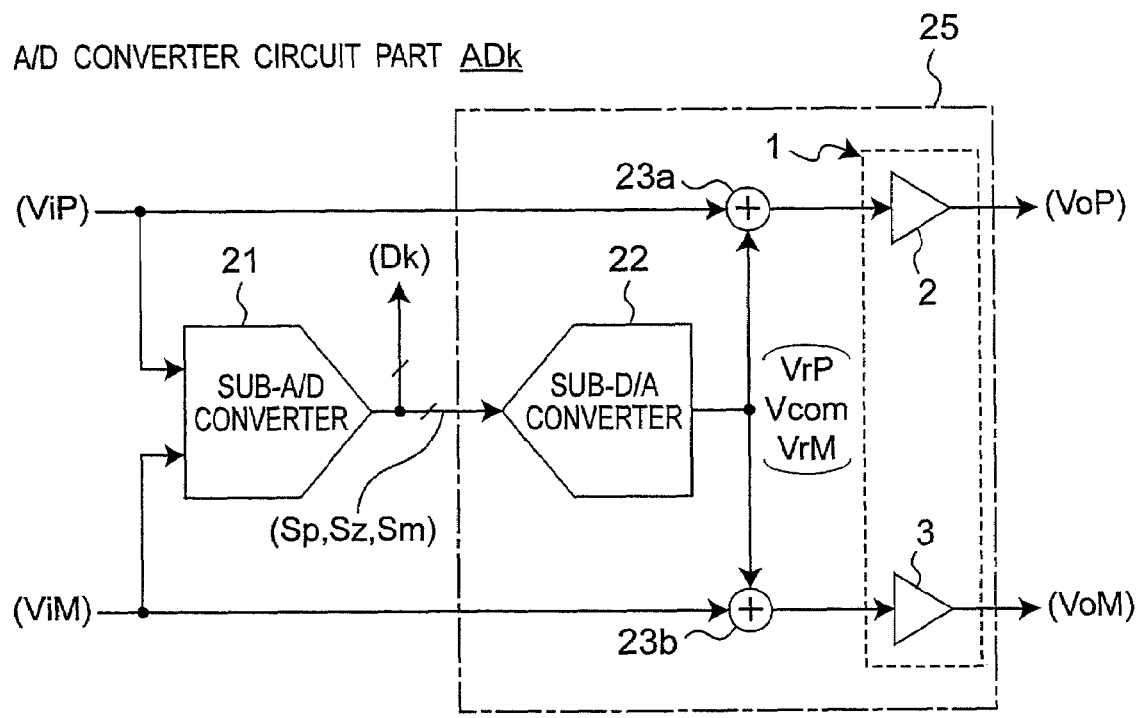
FIG. 2 is a block diagram showing a configuration of an A/D converter circuit part ADk of FIG. 1.
Figure 3:
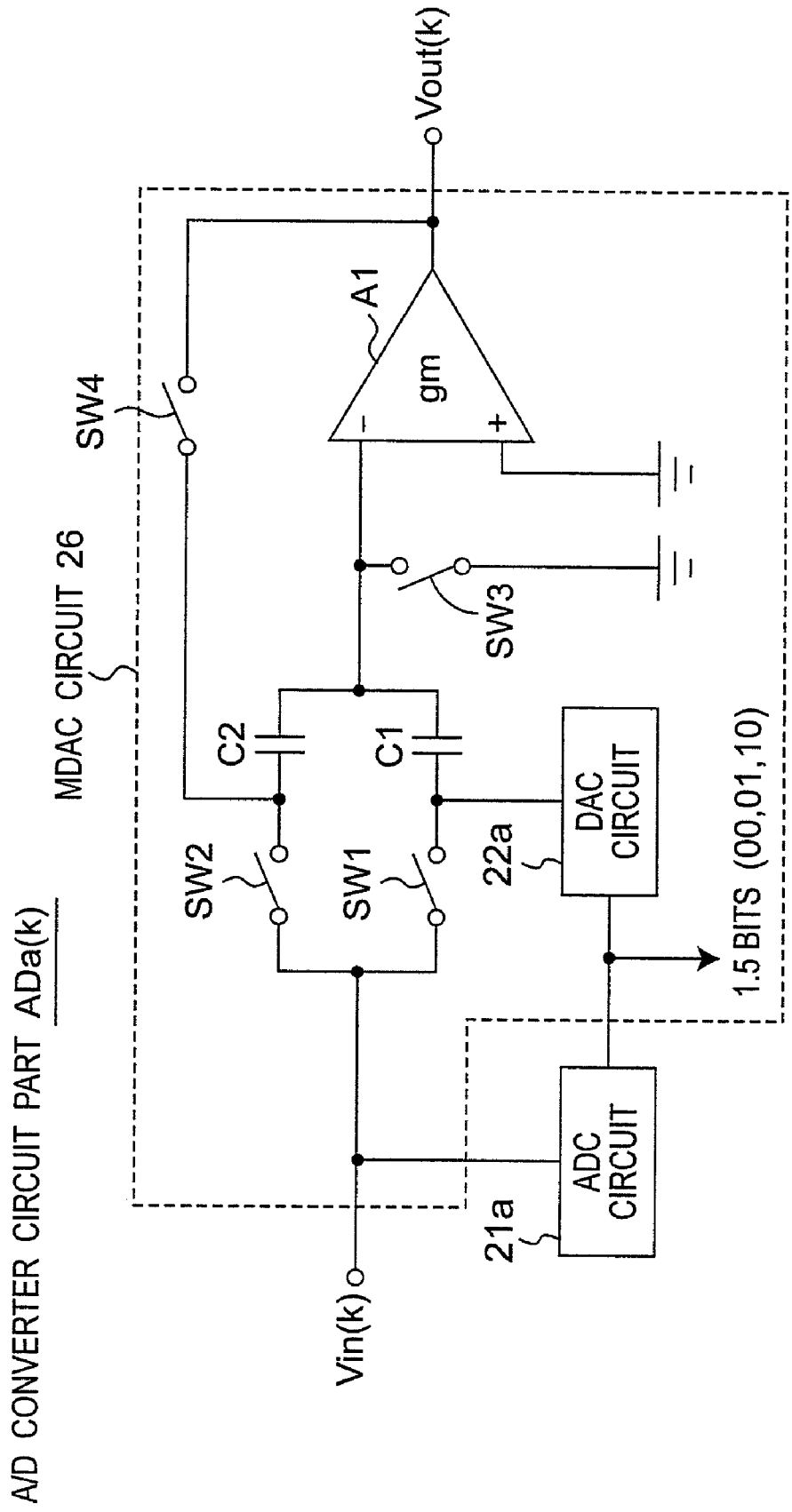
FIG. 3 is a block diagram showing a configuration of a prior art A/D converter circuit part ADa(k)

FIG. 1 is a block diagram showing a configuration of a pipeline A/D converter apparatus according to the first preferred embodiment of the invention, and FIG. 2 is a block diagram showing a configuration of an A/D converter circuit part ADk of FIG. 1. Referring to FIGS. 1 and 2, a structural example of a parallel pipeline type A/D converter apparatus employing a pseudo differential amplifier circuit 1 will be described hereinafter.

Referring to FIG. 1, a parallel pipeline type A/D converter apparatus 10 has a sample holding circuit (hereinafter referred to as a S/H circuit) 11 to which two analog signals having voltage waveforms symmetrical about a predetermined voltage of, for example, the ground voltage are inputted, an operational circuit 12 configured by pipeline type A/D converter circuit parts AD1 to ADm of m stages (where m is a natural and plural number), and an error correction circuit 13 that performs error correction of digital data outputted from the operational circuit 12. The parallel pipeline type A/D converter apparatus 10 further includes a reference voltage generator circuit 14 that generates a plurality of different reference voltages and outputs the voltages to the A/D converter circuit parts AD1 to ADm, and an internal clock and timing signal generator circuit 15 that generates an internal clock signal and timing signals based on an external clock signal CLK and outputs the signals to the S/H circuit 11, the operational circuit 12 and the error correction circuit 13.

The S/H circuit 11 has two input terminals of a positive side input terminal INP and a negative side input terminal INM that constitute inputs to the parallel pipeline type A/D converter apparatus 10. An analog signal on the positive side is inputted to the positive side input terminal INP, and an analog signal on the negative side is inputted to the negative side input terminal INM. The analog signals on the positive and negative sides constitute one pair of signals having signal levels opposite to each other. The S/H circuit 11 performs sampling and holding of the inputted analog signals based on the predetermined clocks signal from the internal clock and timing signal generator 15, and outputs the processed signal to the operational circuit 12.

The A/D converter circuit part 12 is configured by pipeline type A/D converter parts AD1 to ADm of m stages having an identical circuit configuration, and each of the pipeline type A/D converter circuit parts AD1 to ADm carries out n (n>0) bit pipeline type A/D conversion processing. The A/D converter circuit part ADk (k=1 to m) receives the inputs of two signals of a positive side output signal and a negative side output signal, which have signal levels opposing to each other, outputted from the circuit of the preceding stage. That is, a positive side output voltage and a negative side output voltage from the S/H circuit 11 are inputted to the A/D converter circuit AD1 of the first stage, and output voltages on the positive and negative sides of the A/D converter circuit of the preceding stage are inputted to the A/D converter circuits AD2 to ADm of the second and succeeding stages.

Referring to FIG. 2 showing an example of the internal configuration of the A/D converter circuit part ADk, the A/D converter circuit part ADk is configured by a sub-A/D converter 21 that constitutes an n-bit A/D converter, a sub-D/A converter 22 that constitutes an n-bit D/A converter, computing units 23a and 23b, and the pseudo differential amplifier circuit 1 configured by the amplifiers 2 and 3 of FIG. 1. The sub-A/D converter 21 receives the inputs of one pair of output signals outputted from the circuit of the preceding stage as one pair of a positive side input voltage ViP and a negative side input voltage ViM. The sub-A/D converter 21 subjects the inputted positive side input voltage ViP and negative side input voltage ViM to A/D conversion into n-bit data, outputs the data to the error correction circuit 13, and outputs a signal corresponding to the n-bit data to the sub-D/A converter 22.

Referring to FIG. 1, the n-bit data outputted from each of the A/D converter circuit parts AD1 to ADm has a kind of redundant representation, and the error correction circuit 13 converts the n-bit data inputted from each of the A/D converter circuit parts AD1 to ADm into predetermined bit data of a non-redundant representation and outputs the same as A/D-converted digital data from an output terminal OUT. For example, when 1.5-bit data is outputted from each of the A/D converter circuit parts AD1 to ADm, the error correction circuit 13 converts the 1.5-bit data into 1-bit data and outputs the same as A/D-converted digital data. Moreover, referring to FIG. 2, the sub-D/A converter 22 outputs a voltage corresponding to the signal, which has been inputted from the sub-A/D converter 21, to the computing units 23a and 23b. The computing unit 23a carries out operation of the positive side input voltage ViP and the output voltage from the sub-D/A converter 22 by a predetermined method and forms an output to the amplifier 2. The computing unit 23b carries out operation of the negative side input voltage ViM and the output voltage from the sub-D/A converter 22 by a predetermined method and forms an output to the amplifier 3. The amplifier 2 amplifies the inputted voltage and outputs a positive side output voltage VoP, while the amplifier 3 similarly amplifies the inputted voltage and outputs a negative side output voltage VoM.

Reference is herein made based on an example in which the sub-A/D converter 21 is a 1.5-bit A/D converter and the sub-D/A converter 22 is a 1.5-bit D/A converter in the A/D converter circuit part ADk.

The sub-A/D converter 21 calculates an input voltage Vi from the inputted positive side input voltage ViP and negative side input voltage ViM by the following Equation:

$$Vi = ViP - ViM \quad (2).$$

Predetermined reference voltages VrCP and VrCM are inputted from the reference voltage generator circuit 14 to the sub-A/D converter 21. The sub-A/D converter 21 compares the input voltage Vi of the Equation (2) with the reference voltages VrCP and VrCM, and generates data Dk by the following Equation according to the comparison result:

$$\begin{aligned} Dk &= 1 \quad \text{for } VrCP < Vi \\ &= 0 \quad \text{for } VrCM \leq Vi \leq VrCP \\ &= -1 \quad \text{for } Vi < VrCM. \end{aligned} \quad (3)$$

On the other hand, three kinds of predetermined reference voltages VrP, Vcom and VrM are inputted from the reference voltage generator circuit part 14 to the sub-D/A converter 22, and the voltages are set such that VrCP=VrP/4 and VrCM=VrM/4. For example, assuming that Vcom=0 and VrP=Vr, then VrM=−Vr, and VrCP=Vr/4 and VrCM=−Vr/4 in this case. Moreover, the sub-D/A converter 22, the computing units 23a and 23b, and the amplifiers 2 and 3 form an operational circuit 25. The sub-D/A converter 22, the computing unit 23a and the amplifier 2 carry out operation by the following Equation (4) to generate the positive side output voltage VoP. The sub-D/A converter 22, the computing unit 23b and the amplifier 3 carry out operation by the following Equation (5) to generate the negative side output voltage VoM:

$$VoP = 2 \times ViP - RkP \quad (4); \text{ and}$$

$$VoM = 2 \times ViM - RkM \quad (5).$$

In the Equations (4) and (5), RkP=VrP and RkM=VrM for Dk=1; RkP=Vcom and RkM=Vcom for Dk=0; and RkP=VrM and RkM=VrP for Dk=−1.

As described above, the operational circuit 25 generates the positive side output voltage VoP and the negative side output voltage VoM by doubling the positive side input voltage ViP and the negative side input voltage ViM, respectively, and effecting addition and subtraction of the predetermined reference voltage in accordance with the data Dk generated in the sub-A/D converter 21, and outputs the voltages to the A/D converter circuit of the next stage. It is noted that the A/D converter circuit ADm of the final stage may have no operational circuit 25.

Figure 4:
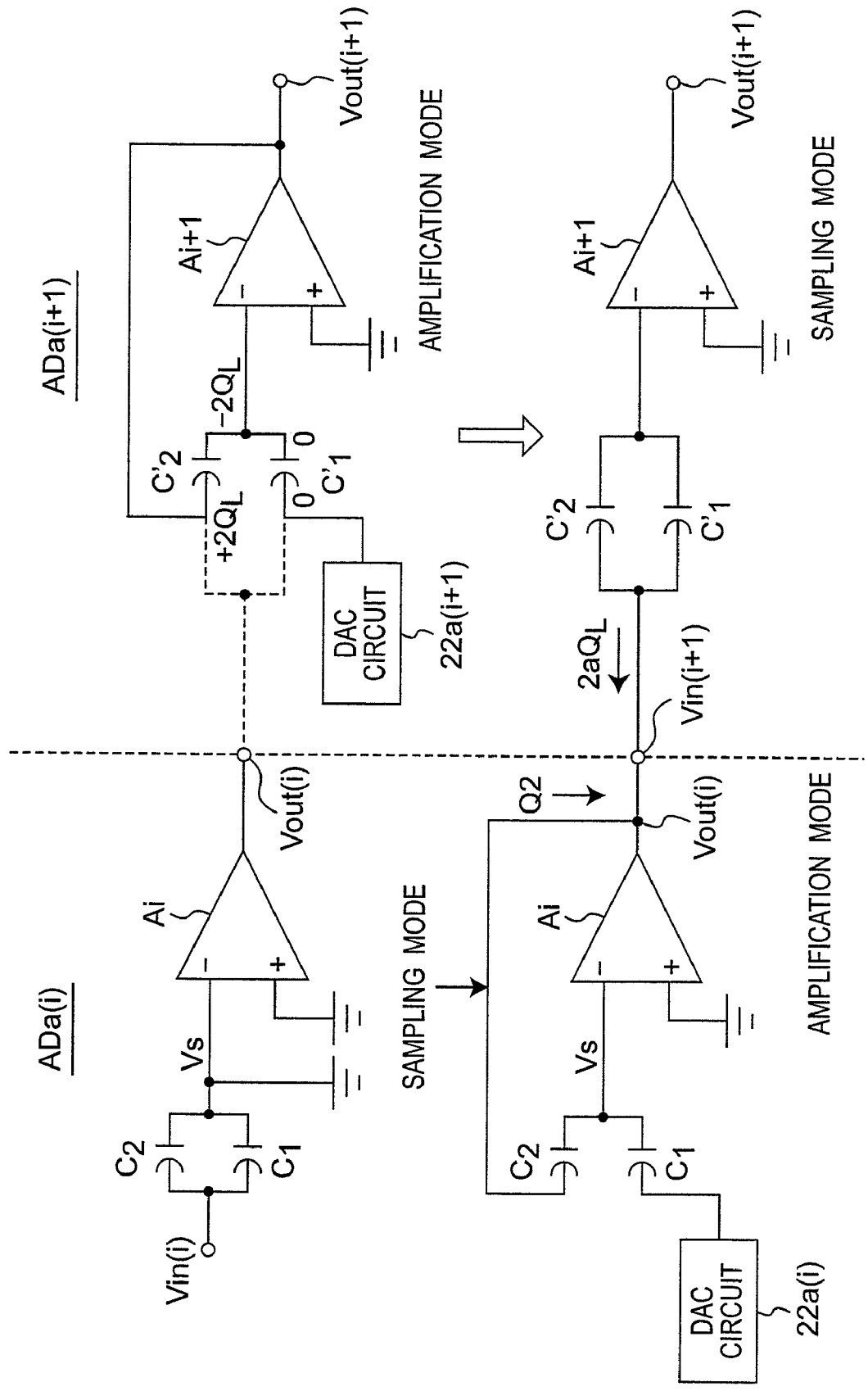
FIG. 4 is a block diagram showing operations of prior art A/D converter circuit parts ADa(i) and ADa(i+1)
Figure 5:
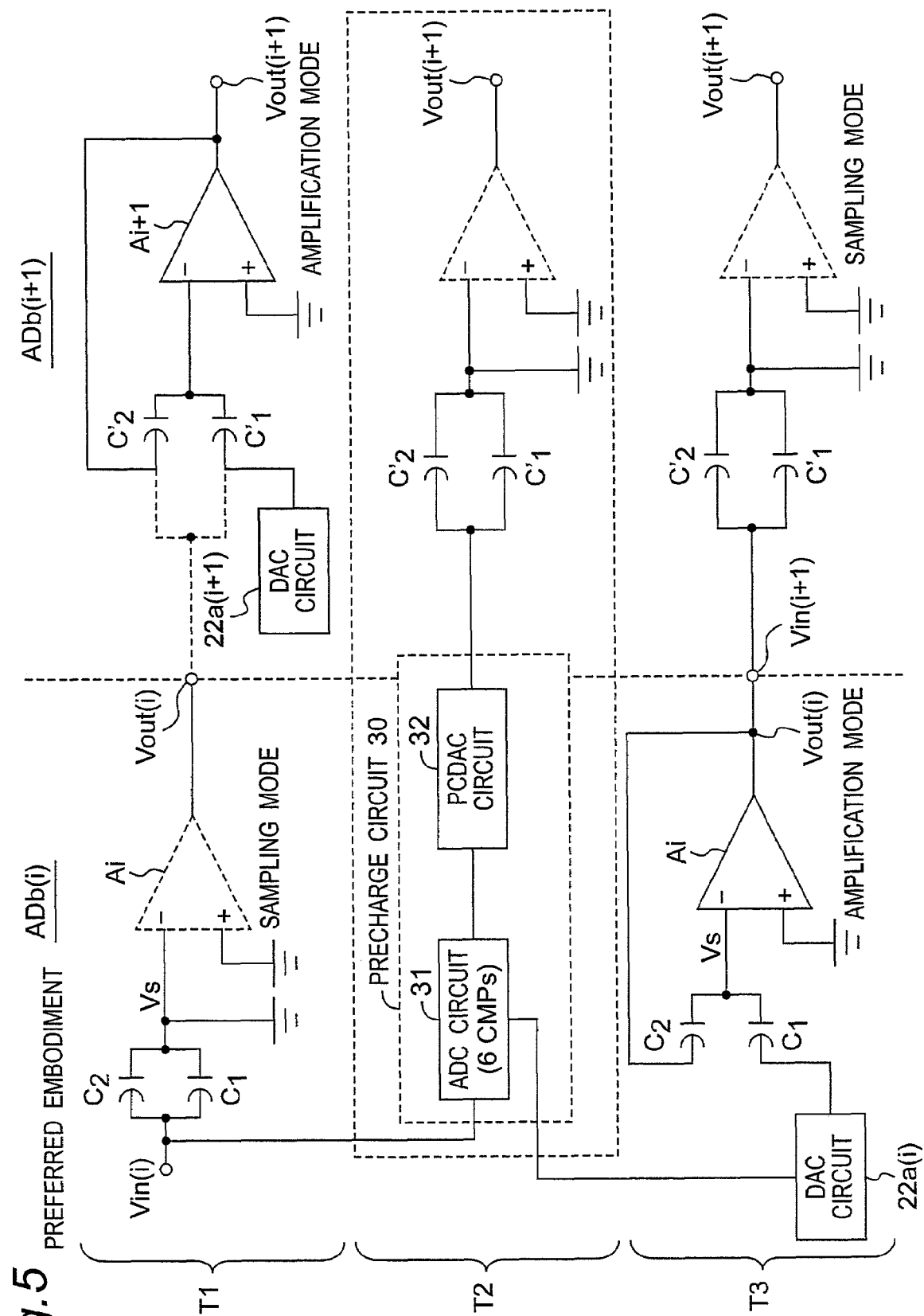
FIG. 5 is a block diagram showing operations of A/D converter circuit parts ADb(i) and ADb(i+1) according to the preferred embodiment of the present invention.

The configuration and action or operation of the precharge system MDAC circuit characteristic of the present preferred embodiment will be described next. FIG. 5 is a block diagram showing operations of A/D converter circuit parts ADb(i) and ADb(i+1) according to the preferred embodiment of the invention. As compared with the prior art A/D converter circuit part ADa(i) of FIG. 4, the A/D converter circuit part ADb(i) of the first preferred embodiment is characterized in that a precharge mode of a precharge circuit 30 that precharges sampling capacitances C1 and C2 is provided for an interval between an interval T1 in the sampling mode and an interval T3 in the amplification mode as shown in FIG. 5. When the A/D converter circuit part ADb(i) of the i-th stage is set in the sampling mode, the A/D converter circuit part ADb(i+1) of the next (i+1)-th stage is set in the amplification mode, and the operation modes are set alternately. The present preferred embodiment proposes a "precharge type MDAC circuit" that shortens the maximum settling time and reduces the power consumption by removing the influence of the precedent sample charge and conversely optimally charging the capacitance of the next stage.

Referring to FIG. 5, the configuration of the precharge type MDAC circuit is provided by incorporating another set of sampling capacitances, a precharge DAC circuit (hereinafter referred to as a PCDAC circuit) 32 and four comparators in addition to the conventional 1.5-bit/stage pipeline A/D converter, and is configured by sampling capacitance sets of two channels and a total of six comparators (included in the pre-A/D converter circuit (hereinafter referred to as an ADC circuit) 31 of FIG. 5). The detailed configuration and action or operation will be described in detail later with reference to FIGS. 10 to 16.

Figure 6:
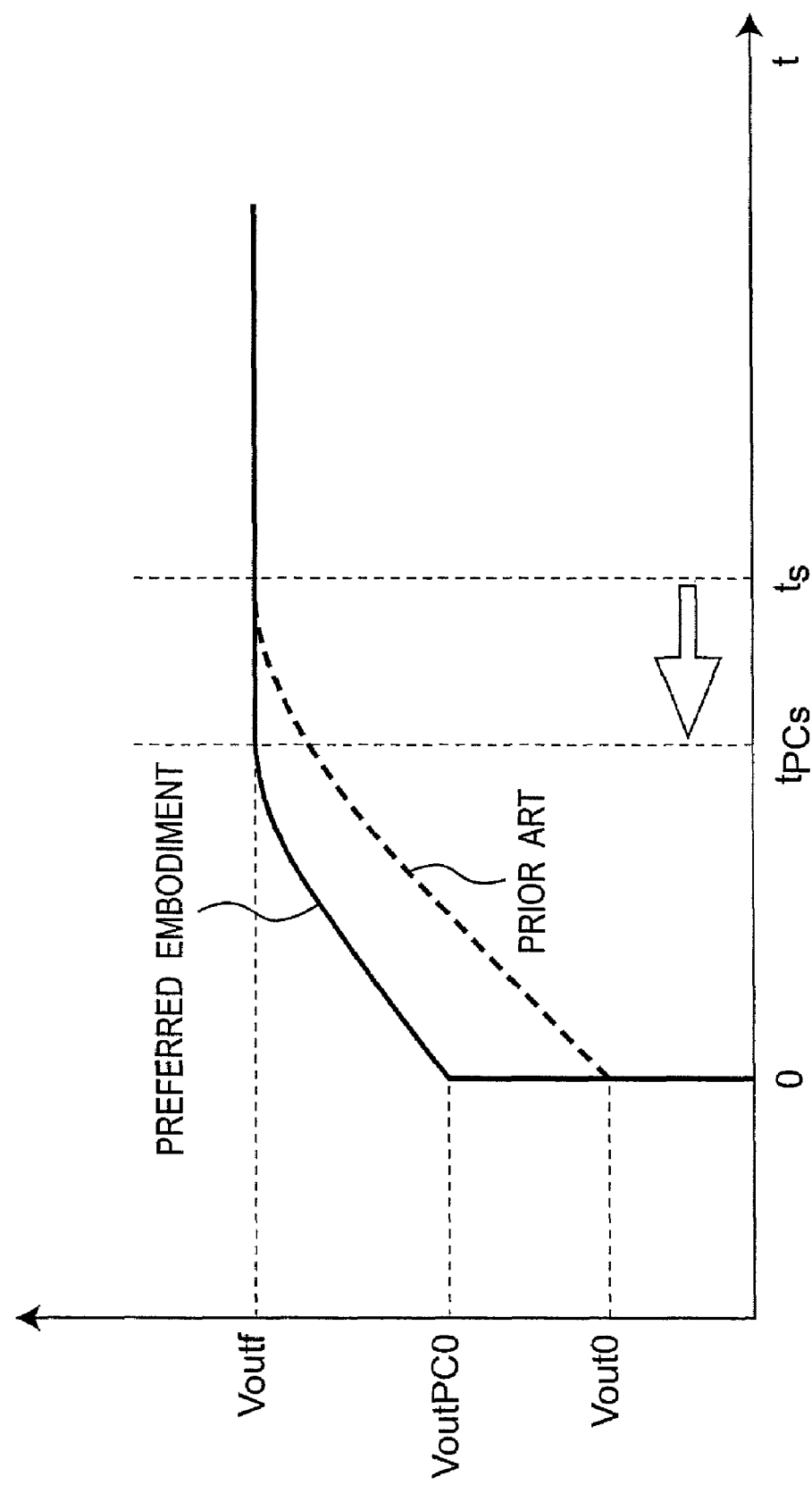
FIG. 6 is a graph showing a transient response of an output voltage Vout from the A/D converter circuit part ADb(i) of the i-th stage of FIG. 5.

In the precharge type MDAC circuit, the sampling capacitances C1 and C2 of the (i+1)-th stage are charged with optimum values by the PCDAC circuit 32 immediately before the comparator performs comparing of the input voltage of the i-th stage, and the (i+1)-th stage is changed into the sampling mode. FIG. 6 is a graph showing a transient response of the output voltage Vout from the A/D converter circuit part ADb(i) of the i-th stage of FIG. 5. Referring to FIG. 6 showing a transient response of the output voltage of the i-th stage, the horizontal axis represents time, and the vertical axis represents the potential. In the case of the conventional A/D converter, an initial voltage Vout0 at the moment (t=0) of mode change is determined depending on the law of conservation of charge and subsequently gradually approaches a final attainment voltage Voutf. The settling time ts are defined by the transition duration from Vout0 to Voutf. In the case of the precharge type MDAC, the initial potential VoutPC0 is determined at a position very close to Voutf by the optimal charge, and therefore, the settling time can be reduced. The voltage to be precharged differs depending on the input voltage.

Figure 7:
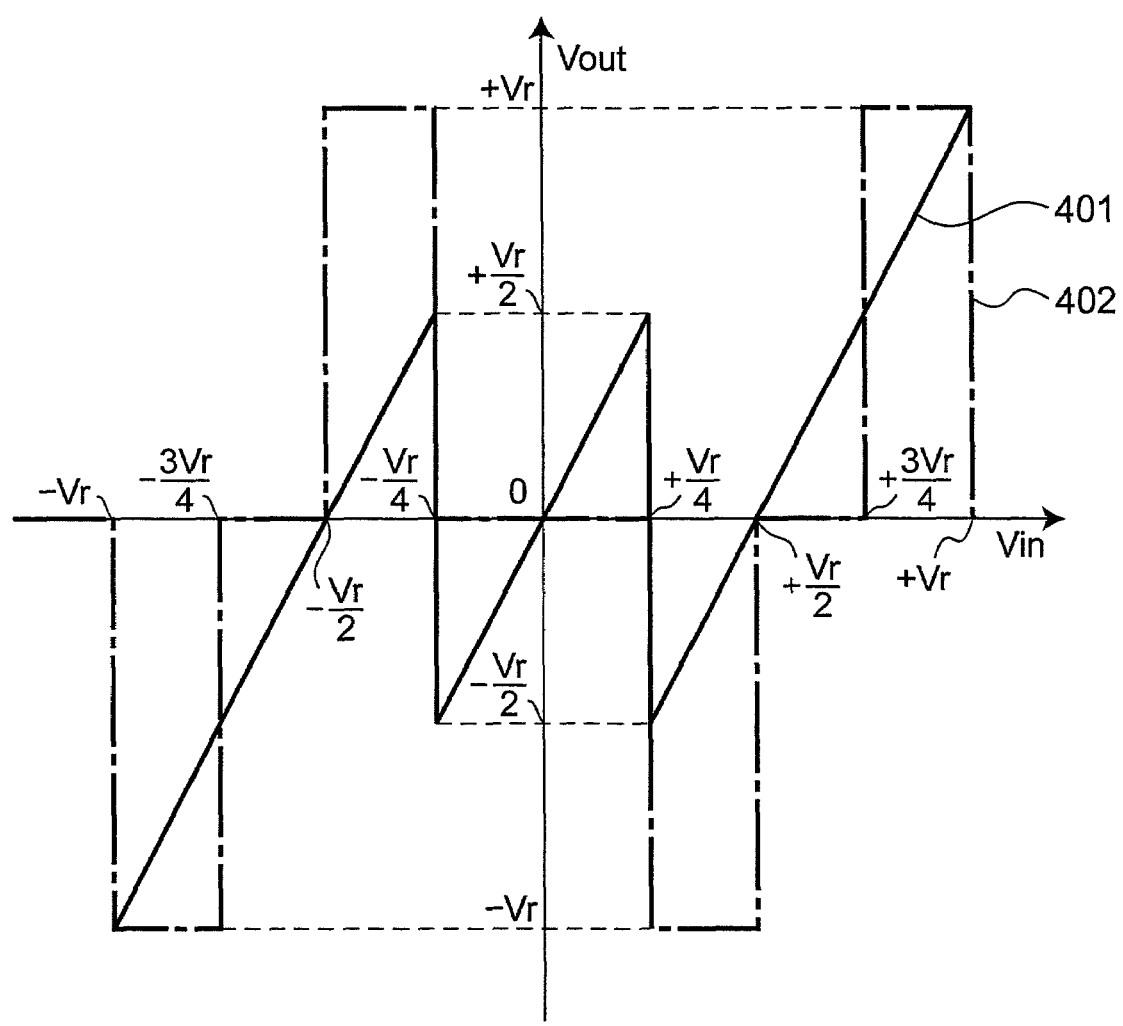
FIG. 7 is a graph showing an analog A/D conversion input to output characteristic 401 and a digital A/D conversion input to output characteristic 402 in a precharge type MDAC circuit 40 (redundant 1.5 bits (three values)/stage, See FIGS. 5 and 10) according to the present preferred embodiment.
Figure 10:
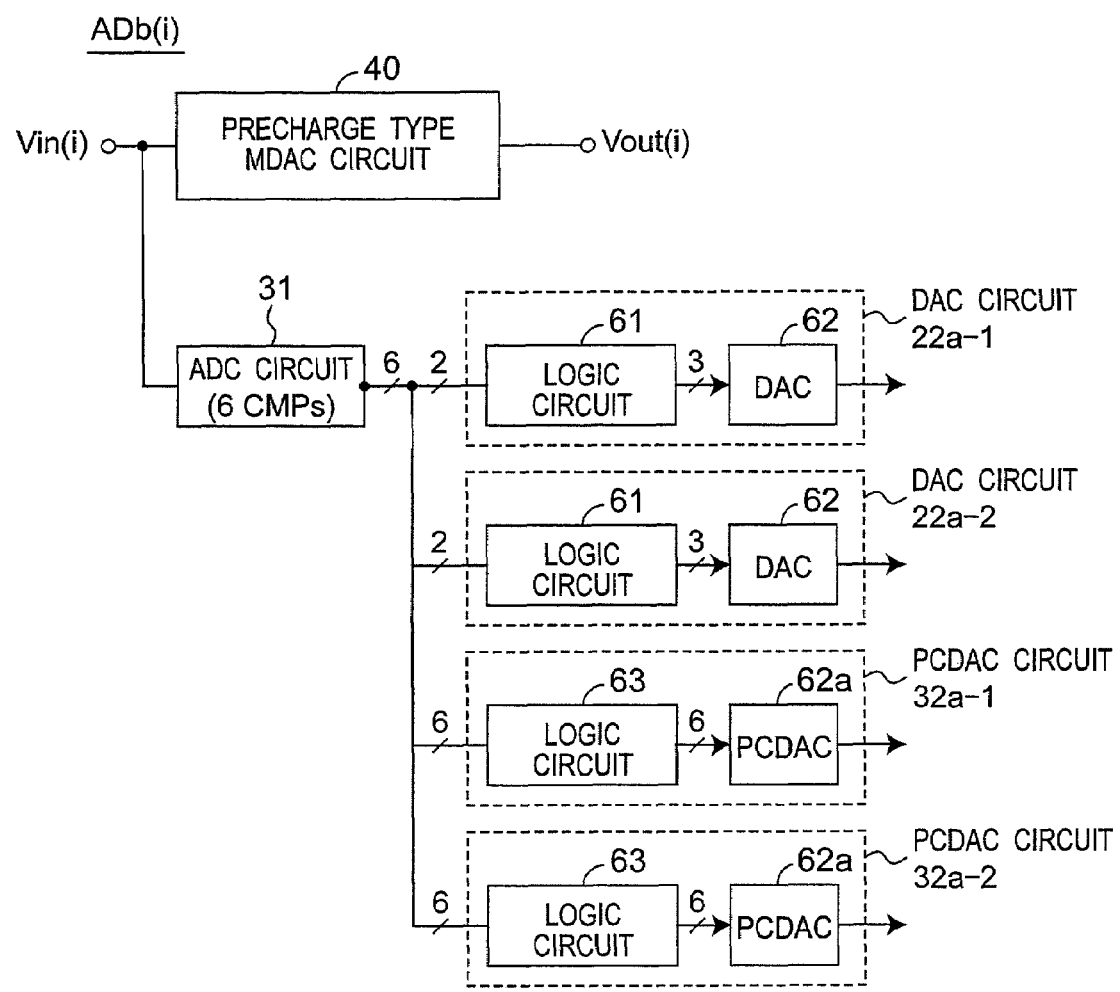
FIG. 10 is a block diagram showing a detailed configuration of the A/D converter circuit part ADb(i) of FIG. 5.

FIG. 7 shows a graph showing an analog A/D conversion input to output characteristic (solid line) 401 and a digital A/D conversion input to output characteristic (alternate long and short dash line) 402 of the pipeline stage in the ADC circuit 31 (See FIG. 10) employed in a precharge type MDAC circuit 40 (redundant 1.5 bits (three values)/stage, See FIGS. 5 and 10) according to the present preferred embodiment. Referring to FIG. 7, a comparator is further provided at the positions of threshold values of Vr/2, −Vr/2, 3Vr/4 and −3Vr/4 in addition to the conventional threshold voltages (where Vr is the reference voltage of the A/D conversion) of Vr/4 and −Vr/4. The input voltage of the i-th stage is detected by the comparator, and the sampling capacitance of the (i+1)-th stage is charged with an appropriate voltage by the PCDAC circuit 32. A voltage Vpc (indicated by the characteristic (alternate long and short dash line) 402 of FIG. 7) to be charged is expressed by the following Equation:

$$\begin{aligned}
Vpc &= 0 &&\text{for } Vin \leq |Vr/4|; \quad (6)\\
&= -Vr &&\text{for } -Vr \leq Vin < -3Vr/4 \text{ or } Vr/4 < Vin \leq Vr/2;\\
&= 0 &&\text{for } -3Vr/4 \leq Vin < -Vr/2 \text{ or } Vr/2 < Vin \leq 3Vr/4;\\
&= Vr &&\text{for } -Vr/2 \leq Vin < -Vr/4 \text{ or } 3Vr/4 < Vin \leq Vr,
\end{aligned}$$

where Vin denotes the input signal voltage, Vout denotes the output signal voltage, and Vr denotes the reference voltage of A/D conversion at the pipeline stage. As is apparent from FIG. 7 and the Equation (6), the digital A/D conversion input to output characteristic (alternate long and short dash line) 402 (redundant 1.5 bits (three values)) in the ADC circuit 31 (See FIG. 10) employed in the precharge type MDAC circuit 40 is set to substantially conform to the analog A/D conversion input to output characteristic (solid line) 401 that outputs three-value output signal voltages of −Vr, 0, and +Vr by using six threshold voltages of −3Vr/4, −Vr/2, −Vr/4, +Vr/4, +Vr/2 and +3Vr/4 corresponding to the six comparators 61 to 66 of FIG. 11 (it is noted that the voltage range of the input signal is predetermined in the actual A/D conversion operation, and neither −Vr nor +Vr is necessary as a threshold value).

Figure 8:
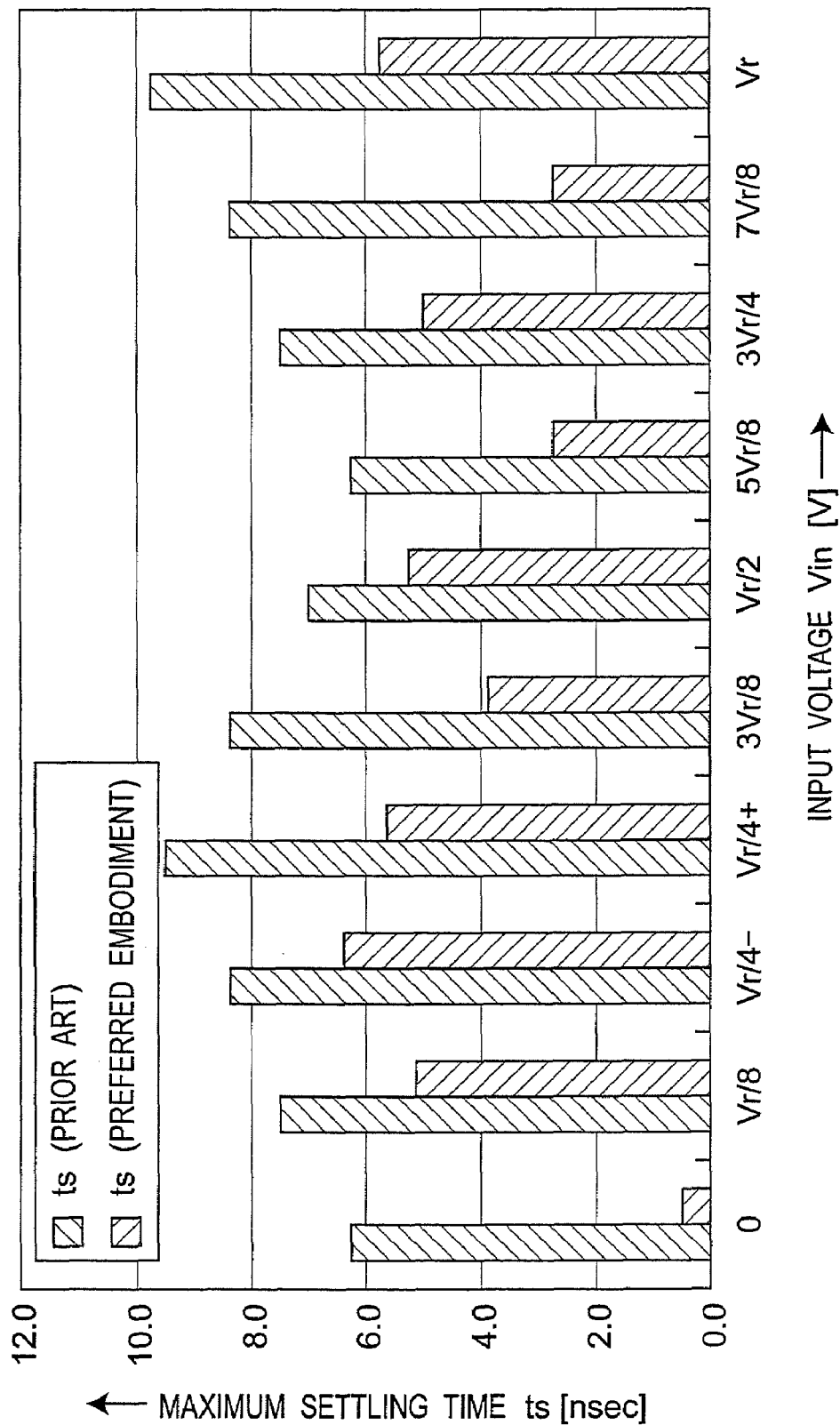
FIG. 8 is a graph showing the maximum settling time ts with respect to an input voltage Vin in the prior art A/D converter part ADa(i) and the A/D converter part ADb(i) of the present preferred embodiment.

The advantageous effect of the precharge type MDAC circuit 40 will be described next. FIG. 8 is a graph showing the maximum settling time ts with respect to an input voltage Vin in the prior art A/D converter part ADa(i) and the A/D converter part ADb(i) of the present preferred embodiment. That is, the simulation results of the maximum settling time in the case of various input voltages of the i-th stage are shown in FIG. 8. In this case, the sampling frequency Fs is 20 MHz, and the settling error is 0.1%. The horizontal axis represents an input voltage, and the vertical axis represents the maximum settling time of the input voltages.

In the prior art MDAC circuit, the maximum settling time results when the input voltage Vin is at or around Vr/4+(input voltage slightly larger than Vr/4) and Vr, and the bias current is determined to satisfy sufficient settling on the worst conditions with respect to the sampling frequency. In the case of the precharge type MDAC circuit 40, it can be understood that the maximum settling time is reduced by about 40 percent at and around Vr/4+ and Vr as compared with the prior art MDAC circuit. However, the cases with a little effect of the precharge effect is newly caused, and therefore, the effective settling time is reduced by 30%. Basically, the settling time and the bias current of the amplifier almost have an inversely proportional relation therebetween, and the bias current can be reduced by 30% on the lower frequency side of the sampling frequency. In a faster sampling frequency band, the relation deviates from the inversely proportional relation due to the influence of the parasitic capacitance of the amplifier, and it becomes difficult to shorten the settling even if the bias current is increased (See, for example, Non-Patent Document 3). Therefore, the settling can effectively be shortened by precharge on the higher frequency side, and a power reduction of equal to or larger than 30% becomes possible. The precharge type MDAC circuit 40 has a simple configuration such that a comparator for prediction is only incorporated into an interleave system of two channels, and the power of the incorporated comparator is much smaller than the power of the amplifier. Moreover, power reduction can be achieved more effectively by concurrently using amplifier sharing. In the precharge type MDAC, the settling can be shortened more effectively when the signal amplitude is larger, and this is a topology very effective for a high-resolution high-speed pipeline A/D converter apparatus.

Figure 9:
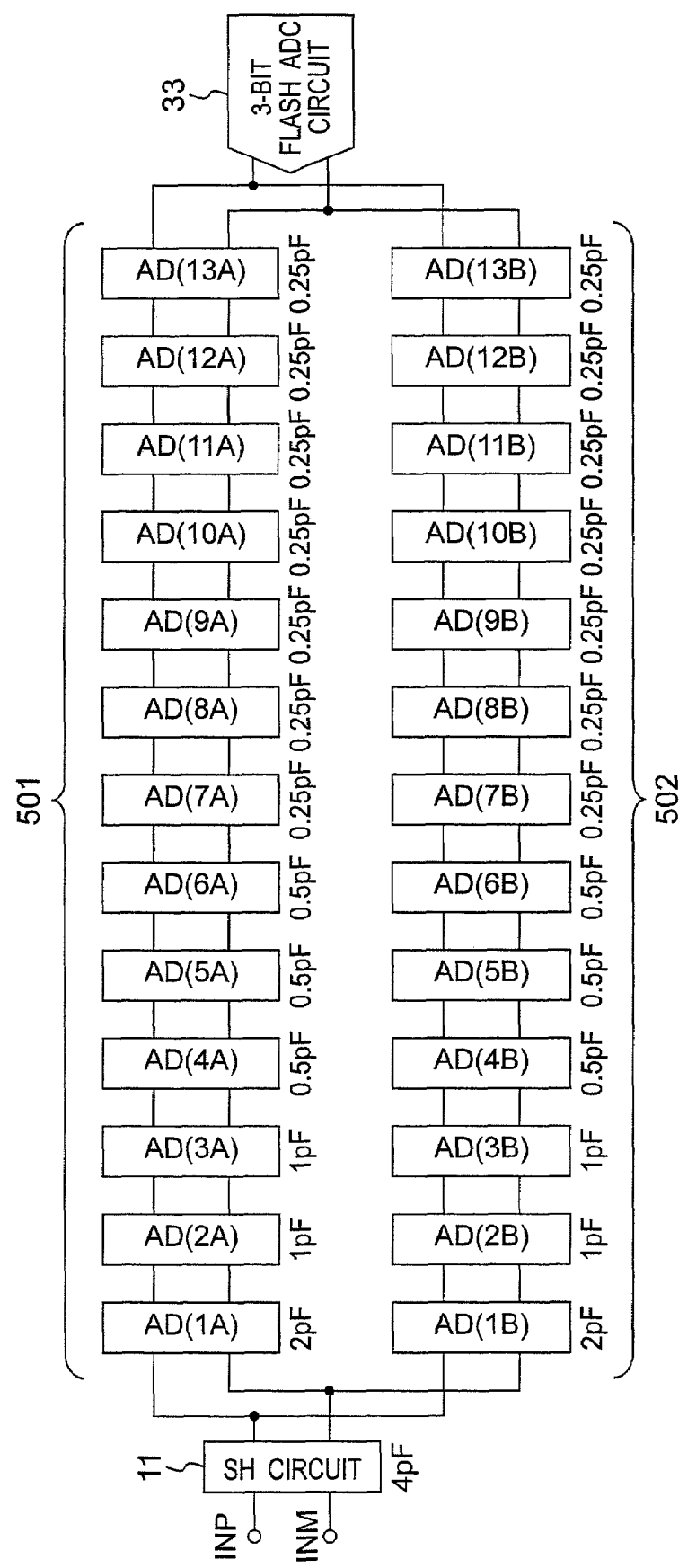
FIG. 9 is a block diagram showing an overall configuration of a 14-bit pipeline A/D converter apparatus employing the A/D converter part ADb(i) of the present preferred embodiment.

FIG. 9 is a block diagram showing an overall configuration of a 14-bit pipeline A/D converter apparatus employing the A/D converter part ADb(i) of the present preferred embodiment. In the pipeline type A/D converter apparatus of FIG. 9, pipeline A/D converter circuit groups 501 and 502 of two systems are provided between the sample holding circuit 11 and a 3-bit flash ADC circuit 33. The pipeline A/D converter circuit group 501 of the first system is configured by 13-stage pipeline A/D converter circuit parts AD(1A) to AD(13A) of a cascade connection, and the pipeline A/D converter circuit group 502 of the second system is configured by 13-stage pipeline A/D converter circuit parts AD(1B) to AD(13B) of a cascade connection. That is, the A/D converter part ADb(i) of the present preferred embodiment is configured by one precharge type sample holding circuit and precharge type MDAC circuits of two channels. An operational amplifier is shared between channels to reduce the power consumption and has a 16-bit output configuration of the MDAC circuits of thirteen stages and the 3-bit ADC circuit of the final stage in consideration of digital correction processing. It is difficult to achieve a high resolution because a skew between channels causes distortions in the ordinary interleave system, and therefore, a skew-free sample holding circuit 11 of one channel is employed. The configuration of the present preferred embodiment includes an on-chip digital correction processing circuit, and a correction coefficients are inputted via a sub-board. An output in a redundant/non-redundant system may be possible, and the correction processing may be even externally done. Noises of the amplifier in the circuit and switch noises are taken into consideration for determining the basic capacitance of the pipeline stage. As shown in FIG. 9, the sampling capacitance is 4 pF in the sample holding circuit 11, and the subsequent scaling is achieved by setting a scaling factor γ approximately to 0.5. In the overall configuration of the pipeline A/D converter apparatus configured as above, a video signal or the like of two channels can be simultaneously subjected to A/D conversion processing by the interleave system. As a result, A/D conversion can be performed at high speed with high accuracy.

The configuration of the pipeline A/D converter circuit groups 501 and 502 of two systems in FIG. 9 can be applied to each of the preferred embodiments and modified preferred embodiment described below. However, the present invention is not limited to this, and it may be configured by only the pipeline A/D converter circuit group 501 of one system.

FIG. 10 is a block diagram showing a detailed configuration of the A/D converter circuit part ADb(i) of FIG. 5. Referring to FIG. 10, the A/D converter circuit part ADb(i) is configured by including a precharge type MDAC circuit 40, an ADC circuit 31, two DAC circuits 22a-1 and 22a-2, and two PCDAC circuits 32-1 and 32-2. In this case, the precharge type MDAC circuit 40 is a circuit of the A/D converter circuit part ADb(i) of FIG. 17 which will be described in detail later, from which the ADC circuit 31, the two DAC circuits 22a-1 and 22a-2, and the two PCDAC circuits 32-1 and 32-2 are excluded. The circuit subjects the input voltage Vin(i) to D/A conversion with receiving a precharge from the precharge circuit and outputs the resulting converted output voltage Vout(i). In this case, the DAC circuits 22a-1 and 22a-2 are prior art circuits including the logic circuit 61 of FIG. 12 and the D/A converter (DAC) 62 of FIG. 13. The PCDAC circuits 32-1 and 32-2 are the novel circuits of the present preferred embodiment including the logic circuit 63 of FIG. 15 and the precharge D/A converter (PCDAC) 62a of FIG. 13.

Figure 11:
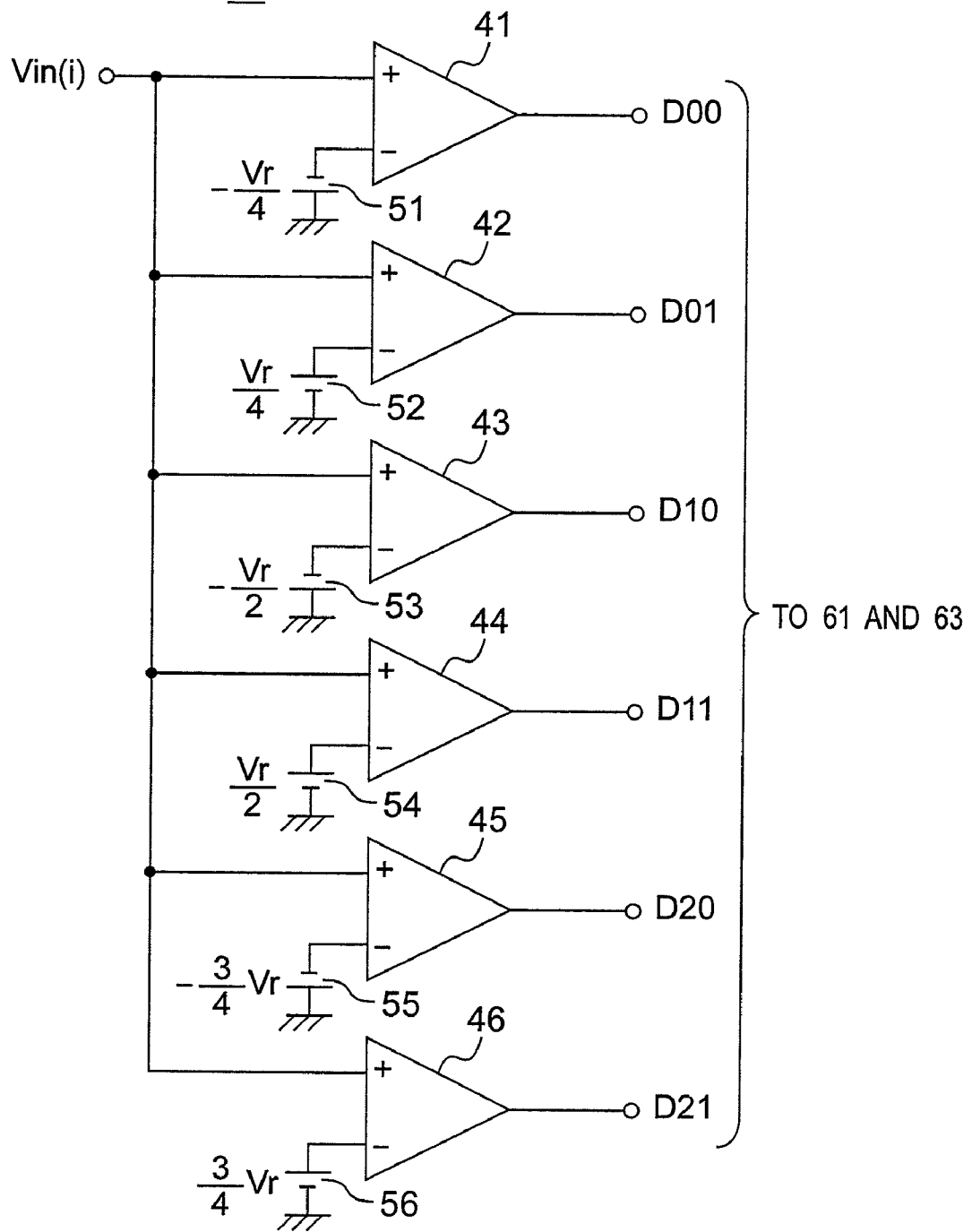
FIG. 11 is a circuit diagram showing a configuration of an ADC circuit 31 of FIG. 10.

FIG. 11 is a circuit diagram showing a configuration of the ADC circuit 31 of FIG. 10. Referring to FIG. 11, the ADC circuit 31 is constituted of six comparators 41 to 46 and six reference voltage sources 51 to 56.

The comparator 41 compares the input voltage Vin(i) with the threshold voltage −Vr/4 from the reference voltage source 51 and outputs a high-level binary signal D00 to the logic circuits 61 and 63 when Vin(i)≧−Vr/4 or outputs a low-level binary signal D00 to the logic circuits 61 and 63 when Vin(i)≦−Vr/4. The comparator 42 compares the input voltage Vin(i) with the threshold voltage Vr/4 from the reference voltage source 52 and outputs a high-level binary signal D01 to the logic circuits 61 and 63 when Vin(i)≧Vr/4 or outputs a low-level binary signal D01 to the logic circuits 61 and 63 when Vin(i)≦Vr/4. Further, the comparator 43 compares the input voltage Vin(i) with the threshold voltage −Vr/2 from the reference voltage source 53 and outputs a high-level binary signal D10 to the logic circuits 61 and 63 when Vin(i)≧−Vr/2 or outputs a low-level binary signal D10 to the logic circuits 61 and 63 when Vin(i)≦−Vr/2.

The comparator 44 compares the input voltage Vin(i) with the threshold voltage Vr/2 from the reference voltage source 54 and outputs a high-level binary signal D11 to the logic circuits 61 and 63 when Vin(i)≧Vr/2 or outputs a low-level binary signal D11 to the logic circuits 61 and 63 when Vin(i)≦Vr/2. The comparator 45 compares the input voltage Vin(i) with the threshold voltage −3Vr/4 from the reference voltage source 55 and outputs a high-level binary signal D20 to the logic circuits 61 and 63 when Vin(i)≧−3Vr/4 or outputs a low-level binary signal D20 to the logic circuits 61 and 63 when Vin(i)≦−3Vr/4. Further, the comparator 46 compares the input voltage Vin(i) with the threshold voltage 3Vr/4 from the reference voltage source 56, and outputs a high-level binary signal D21 to the logic circuits 61 and 63 when Vin(i)≦3Vr/4 or outputs a low-level binary signal D21 to the logic circuits 61 and 63 when Vin(i)<3Vr/4.

Figure 12:
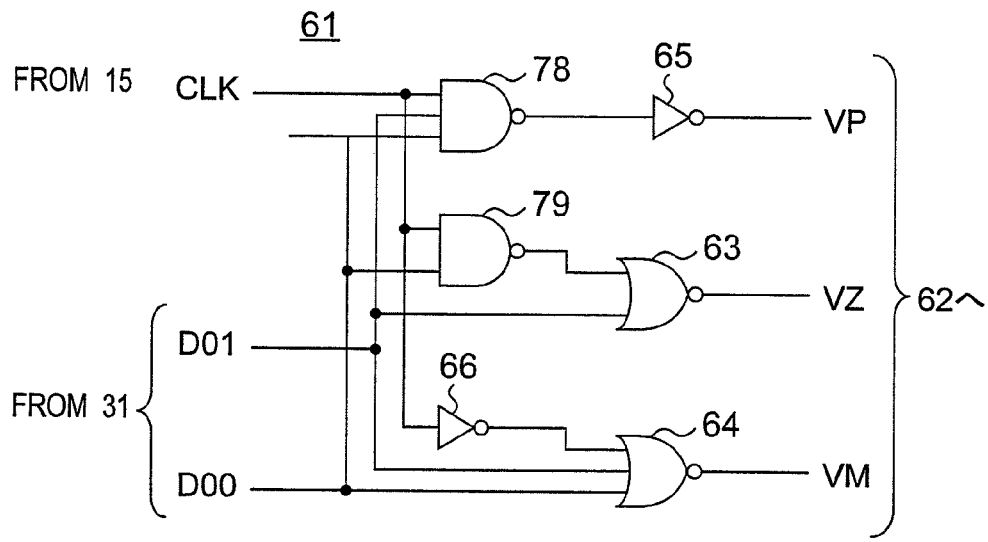
FIG. 12 is a circuit diagram showing a configuration of a logic circuit 61 of FIG. 10.

FIG. 12 is a circuit diagram showing a configuration of the logic circuit 61 of FIG. 10. Referring to FIG. 12, the logic circuit 61 is constituted of two NAND gates 78 and 79, two NOR gates 63 and 64, and two inverters 65 and 66. The logic circuit 61 generates binary signals VP, VZ and VM based on the clock signal CLK and the two binary signals D01 and D00 and outputs the signals to the DAC 62.

Figure 13:
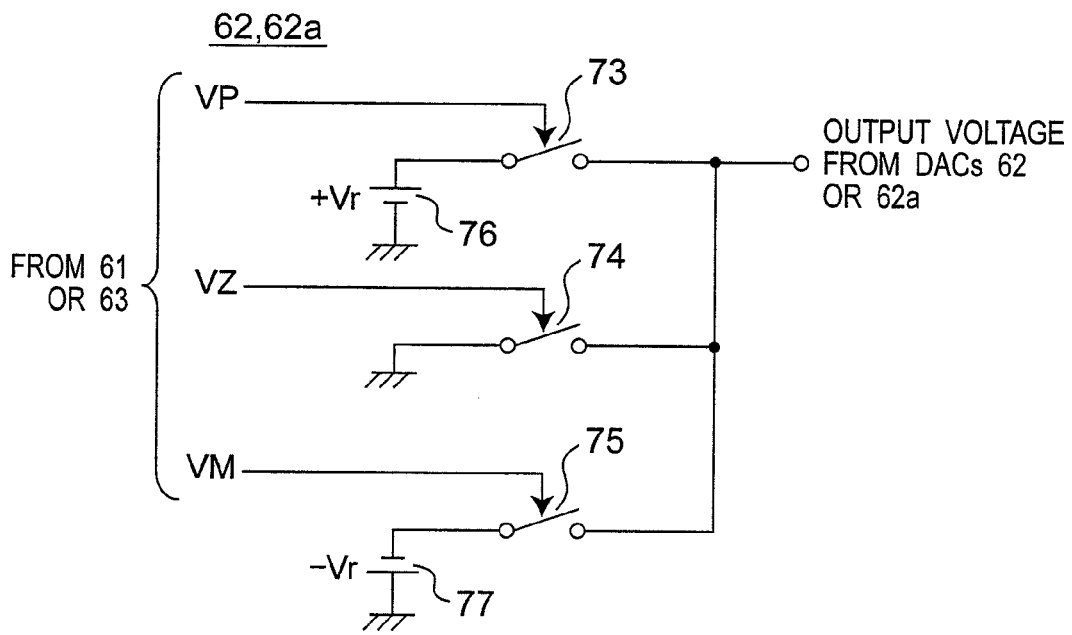
FIG. 13 is a circuit diagram showing a configuration of a D/A converter (DAC) 62 and a precharge D/A converter (PCDAC) 62a of FIG. 10.

FIG. 13 is a circuit diagram showing a configuration of the D/A converter (DAC) 62 and the precharge D/A converter (PCDAC) 62a of FIG. 10. Referring to FIG. 13, the D/A converters 62 and 62a are each constituted of three switches 73, 74 and 75 (actually configured by a CMOS circuit) and two reference voltage sources 76 and 77. The switch 73 is turned on in response to a high-level binary signal VP to output the voltage +Vr from the reference voltage source 76 as an output voltage from the DAC 62 or 62a or turned off in response to a low-level binary signal VP not to output the voltage +Vr from the reference voltage source 76. The switch 74 is turned on in response to the high-level binary signal VP to output the ground voltage (0 V) as an output voltage from the DAC 62 or 62a or turned off in response to the low-level binary signal VP to form no output. Further, the switch 75 is turned on in response to a high-level binary signal VM to output the voltage −Vr from the reference voltage source 77 as an output voltage from the DAC 62 or 62a or turned off in response to a low-level binary signal VM not to output the voltage −Vr from the reference voltage source 76. Therefore, the D/A converters 62 and 62a output any one of the voltages +Vr, the ground voltage and the voltage −Vr as the output voltage based on the binary signals VP, VZ and VM inputted from the logic circuit 61 or 63 (See FIGS. 14 and 16).

FIG. 14 is a table showing operations of the logic circuits 61 and 62 of FIG. 10 and showing signal levels of the binary signals D00, D01, VP, VZ and VM with respect to the voltage ranges RA, RB and RC of the input voltage Vin and the output voltage of the DAC 62. In the rows of the signal levels of the binary signals D00, D01, VP, VZ and VM of FIG. 14, the high level is represented by "1", and the low level is represented by "0". The voltage ranges RA, RB and RC of the input voltage Vin are expressed by the following Equations:

$$RA: -Vr \leq Vin < -Vr/4 \quad (7);$$

$$RB: -Vr/4 \leq Vin \leq Vr/4 \quad (8); \text{ and}$$

$$RC: Vr/4 < Vin \leq Vr \quad (9).$$

As is apparent from FIG. 14, the D/A converter 62 outputs the voltage −Vr when the input voltage Vin is ranged within the voltage range RA. The D/A converter 62 outputs the ground voltage (0 V) when the input voltage Vin is ranged within the voltage range RB. The D/A converter 62 outputs the voltage +Vr when the input voltage Vin is ranged within the voltage range RC.

Figure 15:
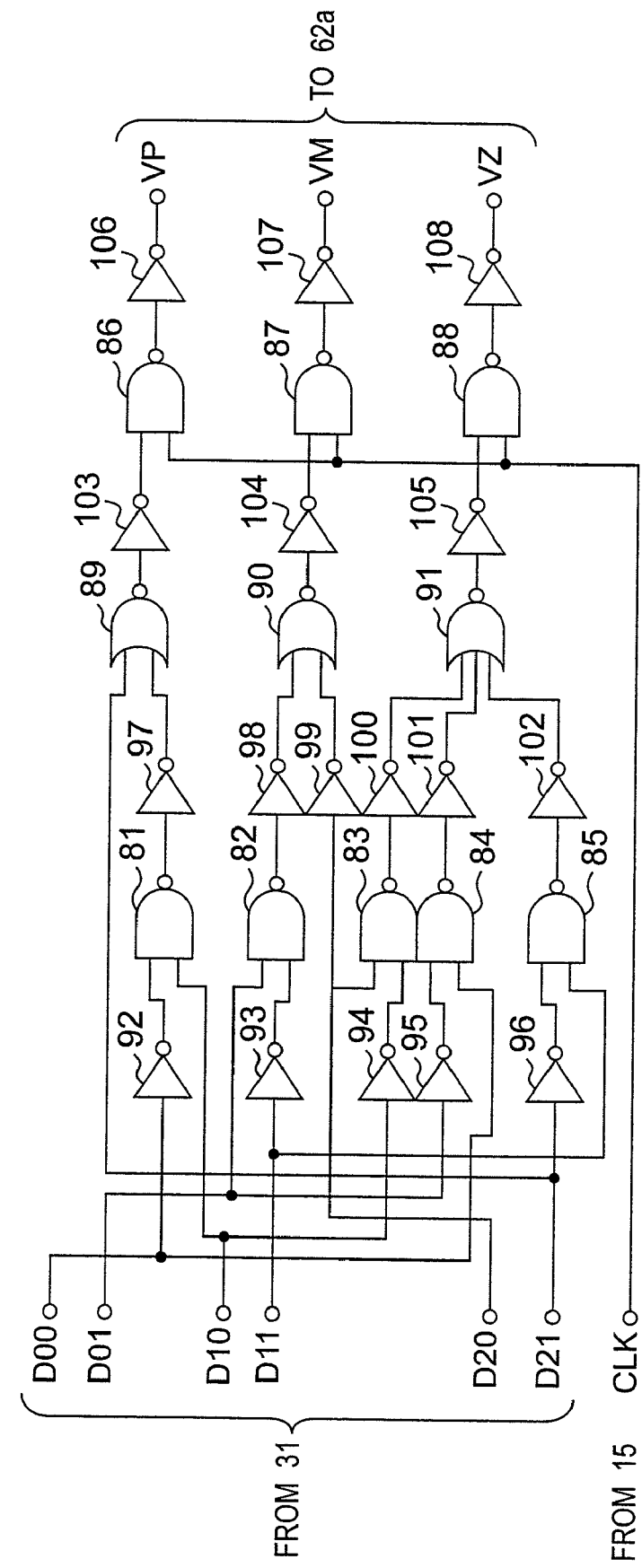
FIG. 15 is a circuit diagram showing a configuration of a logic circuit 63 of FIG. 10.

FIG. 15 is a circuit diagram showing a configuration of the logic circuit 63 of FIG. 10. Referring to FIG. 15, the logic circuit 63 is constituted of NAND gates 81 to 88, three NOR gates 89, 90 and 91 and seventeen inverters 92 to 108. The logic circuit 63 generates binary signals VP, VM and VZ based on the binary signals D00, D01, D10, D11, D20 and D21 from the ADC circuit 31 and the clock signal CLK from the internal clock and timing signal generator circuit 15, and outputs the signals to the D/A converter (DAC) 62.

FIG. 16 is a table showing operations of the logic circuit 63 and the precharge D/A converter (PCDAC) 62a of FIG. 10 and showing signal voltages of the binary signals D00, D01, D10, D11, D20 and D21 with respect to the voltage ranges RP to RV of the input voltage Vin and the output voltage of the PCDAC circuit 62a. In the rows of the signal levels of the binary signals D00, D01, D10, D11, D20, D21, VP, VZ and VM of FIG. 16, the high level is represented by "1", and the low level is represented by "0". The voltage ranges RP to RV of the input voltage Vin are expressed by the following Equations:

$$RP: -Vr \leq Vin < -3Vr/4 \quad (10);$$

$$RQ: -3Vr/4 \leq Vin < -Vr/2 \quad (11);$$

$$RR: -Vr/2 \leq Vin < -Vr/4 \quad (12);$$

$$RS: -Vr/4 \leq Vin \leq Vr/4 \quad (13);$$

$$RT: Vr/4 < Vin \leq Vr/2 \quad (14);$$

$$RU: Vr/2 < Vin \leq 3Vr/4 \quad (15); \text{ and}$$

$$RV: 3Vr/4 < Vin \leq Vr \quad (16).$$

As is apparent from FIG. 16, the D/A converter 62 outputs the voltage −Vr when the input voltage Vin is ranged within the voltage range RP, and the D/A converter 62 outputs the ground voltage (0 V) when the input voltage Vin is ranged within the voltage range RQ. The D/A converter 62 outputs the voltage +Vr when the input voltage Vin is ranged within the voltage range RR, and the D/A converter 62 outputs the ground voltage (0 V) when the input voltage Vin is ranged within the voltage range RS. Further, the D/A converter 62 outputs the voltage −Vr when the input voltage Vin is ranged within the voltage range RT, and the D/A converter 62 outputs the ground voltage (0V) when the input voltage Vin is ranged within the voltage range RU. Furthermore, the D/A converter 62 outputs the voltage +Vr when the input voltage Vin is ranged within the voltage range RV.

Figure 17:
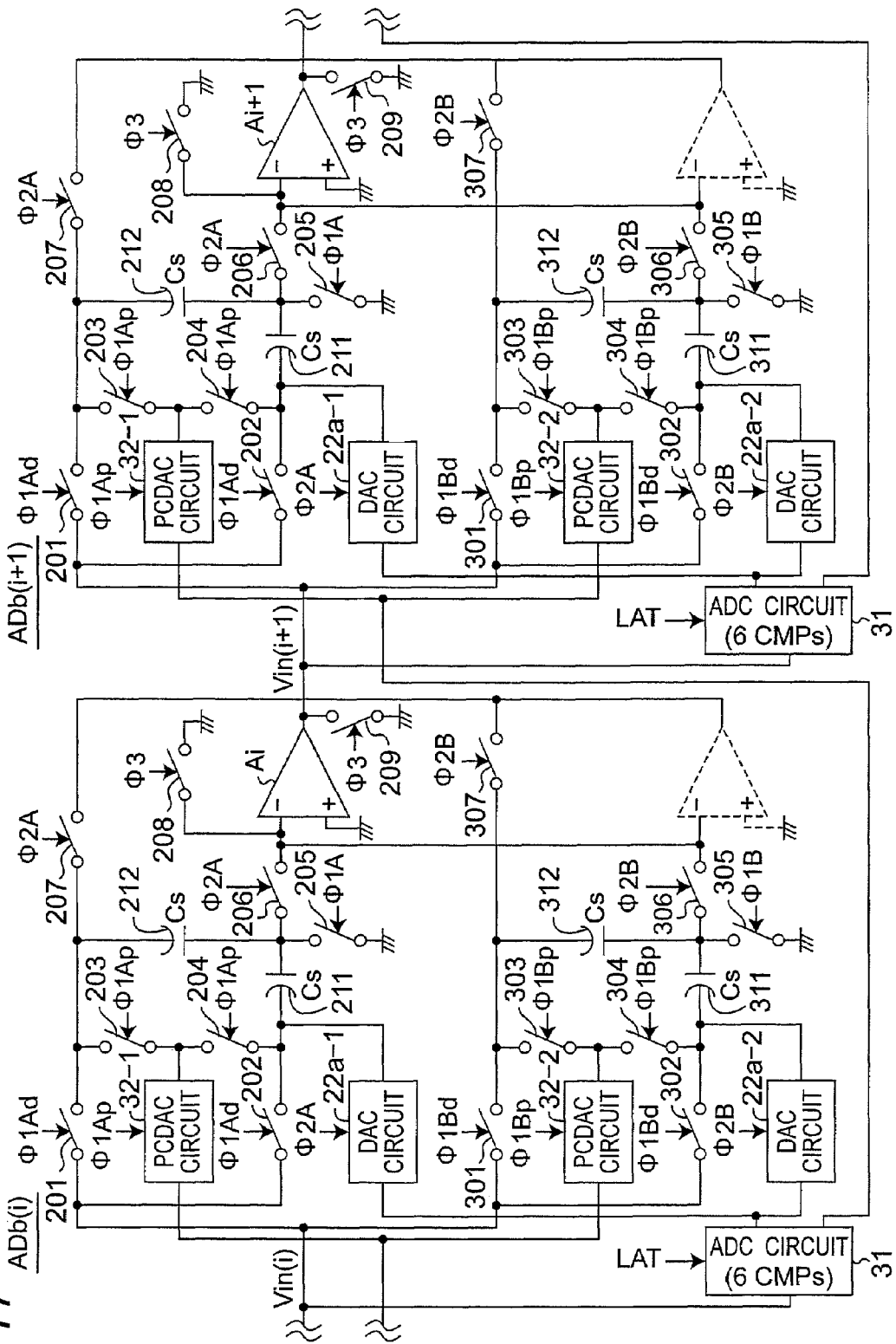
FIG. 17 is a circuit diagram showing a detailed configuration of the A/D converter circuit parts ADb(i) and ADb(i+1) of the first preferred embodiment of the present invention.
Figure 18:
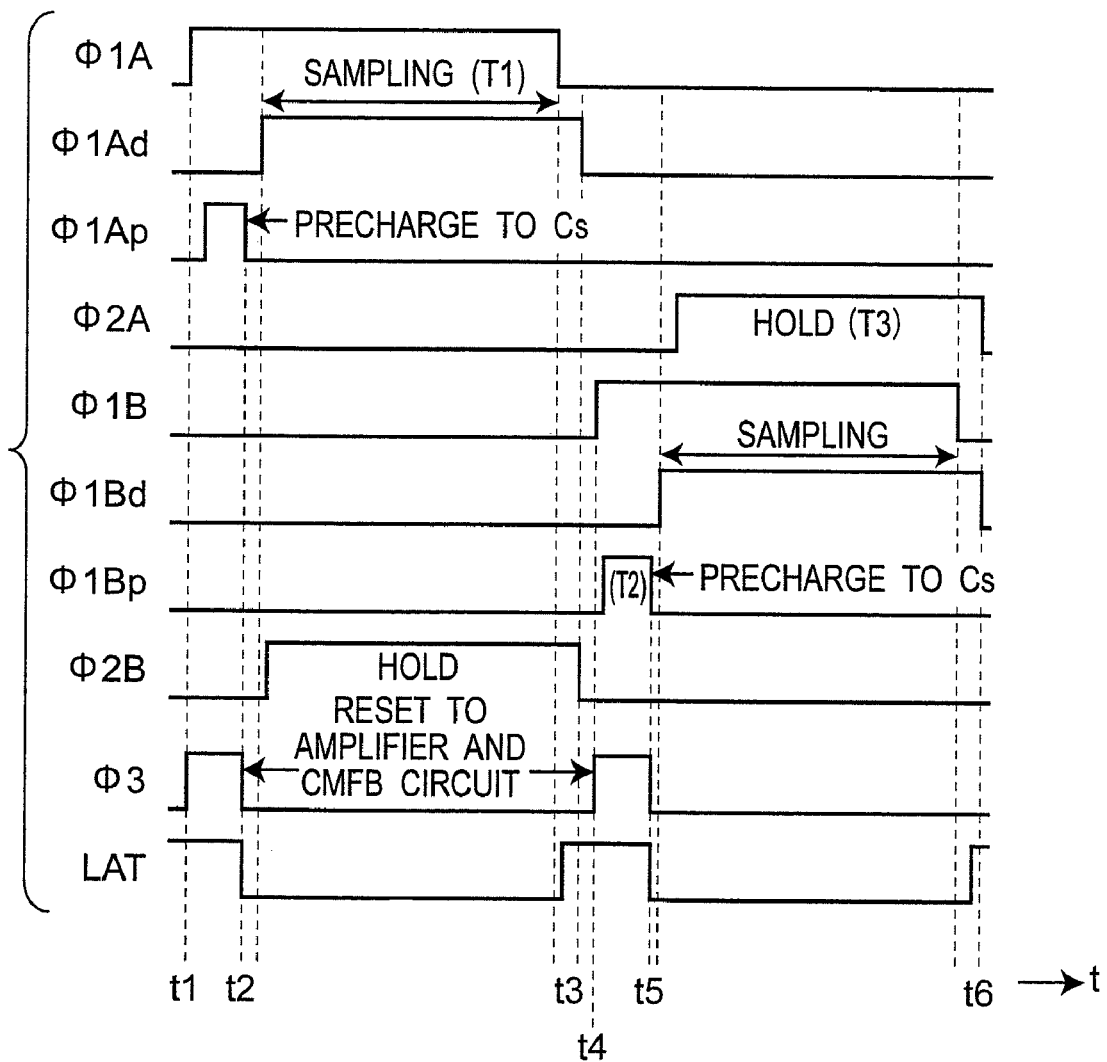
FIG. 18 is a timing chart of an internal clock and timing signals showing operations of the A/D converter circuit parts ADb(i) and ADb(i+1) of FIG. 17.

FIG. 17 is a circuit diagram showing a detailed configuration of the A/D converter circuit parts ADb(i) and ADb(i+1) of the first preferred embodiment of the invention. FIG. 18 is a timing chart of the internal clock and timing signals showing operations of the A/D converter circuit parts ADb(i) and ADb(i+1) of FIG. 17. Referring to FIG. 17, the A/D converter circuit part ADb(i) includes the following:

(1) an ADC circuit 31 that subjects the input voltage Vin to A/D conversion by using six comparators 41 to 46;

(2) a first MDAC circuit (upper side in FIG. 17) including a switched capacitor circuit, which has switches 201 to 209, two capacitors 211 and 212 of a sampling capacitance Cs and an amplifier-shared operational amplifier Ai, performs sampling and holding of the input voltage Vin(i) and outputs the A/D-converted output voltage Vout(i);

(3) a DAC circuit 22a-1 that outputs the A/D-converted voltage from the preceding stage to the first MDAC circuit;

(4) a PCDAC circuit 32-1 that applies a precharge voltage Vpc to the two capacitors 211 and 212 of the sampling capacitance Cs;

(5) a second MDAC circuit (lower side in FIG. 17) including a switched capacitor circuit having switches 301 to 309, two capacitors 311 and 312 of the sampling capacitance Cs and the operational amplifiers Ai, performs sampling and holding of the input voltage Vin(i) and outputs the A/D-converted output voltage Vout(i);

(6) a DAC circuit 22a-2 that outputs the A/D-converted voltage from the preceding stage to the second MDAC circuit; and (7) a PCDAC circuit 32-2 that applies the precharge voltage Vpc to the two capacitors 311 and 312 of the sampling capacitance Cs.

In the A/D converter circuit part ADb(i) configured as above, timing signals applied to the switches 201 to 209 and 301 to 309 are generated in a manner similar to that of FIG. 18 by the internal clock and timing signal generator circuit 15 of FIG. 1. That is, after timing signals φ1A and φ3 rise at the time t1 of FIG. 18, the operational amplifier Ai and the CMFB circuit are reset, and the capacitors 211 and 212 of the sampling capacitance Cs are charged until the time t2 for the pulse interval of a timing signal φ1Ap. Subsequently, the input voltage Vin(i) is sampled for an interval T1 from the rise time of the timing signal φ1Ad to the fall time of the timing signal φ1A. Then, after timing signals φ1B and φ3 rise at the time t4, the capacitors 311 and 312 of the sampling capacitance Cs in the second MDAC circuit are precharged for the interval T2 until the time t5 in response to the pulse of a timing signal φ1Bp. Subsequently, the precharge is held until the time t6 for the pulse interval T3 of a timing signal φ2A. The other timing signals represent the operations carried out concurrently on the background in the other channel.

The A/D converter circuit part ADb(i) of the pipeline A/D converter apparatus of the present preferred embodiment employs the operational amplifier Ai of the capacitive coupling type AB-class cascode amplifier and the CMFB circuit for the switched capacitor, and therefore, one reset time is necessary during one clock interval. The sampling capacitance Cs of the next stage is optimally charged during the reset interval. Taking the MDAC circuit of the i-th stage as an example, the MDAC circuit of the i-th stage samples the input voltage Vin(i) by a timing signal Φ1Ad when the MDAC circuit of the (i−1)-th stage is set in the hold mode by a timing signal Φ2B. Due to the entry of a latch signal LAT immediately before the end of the timing signal Φ2B, the six comparators 41 to 46 in the ADC circuit 31 make judgments of an output voltage from the MDAC circuit of the (i−1)-th stage, and the operation result is delivered to the precharge DAC (PCDAC) circuits 22a-1 and 22a-2. The sampling capacitance Cs of the (i+1)-th stage is optimally charged in response to the timing signal Φ1Bp, and therefore, the settling time is shortened in the hold mode of the MDAC circuit of i-th stage in response to a timing signal Φ2A.

Next, performance evaluation and results of the pipeline A/D converter apparatus made on the experimental basis by the present inventors and others will be described below. The pipeline type A/D converter apparatus was made on the experimental basis by using the 0.25-μm process technology of a 1-poly 5-metal structure (5M1P structure). The sampling capacitances Cs were all configured by MIM capacitances, and a triple well structure was used for the transistor. The chip occupation area of the A/D converter part of one channel was 4.0 mm×2.0 mm.

Figure 19:
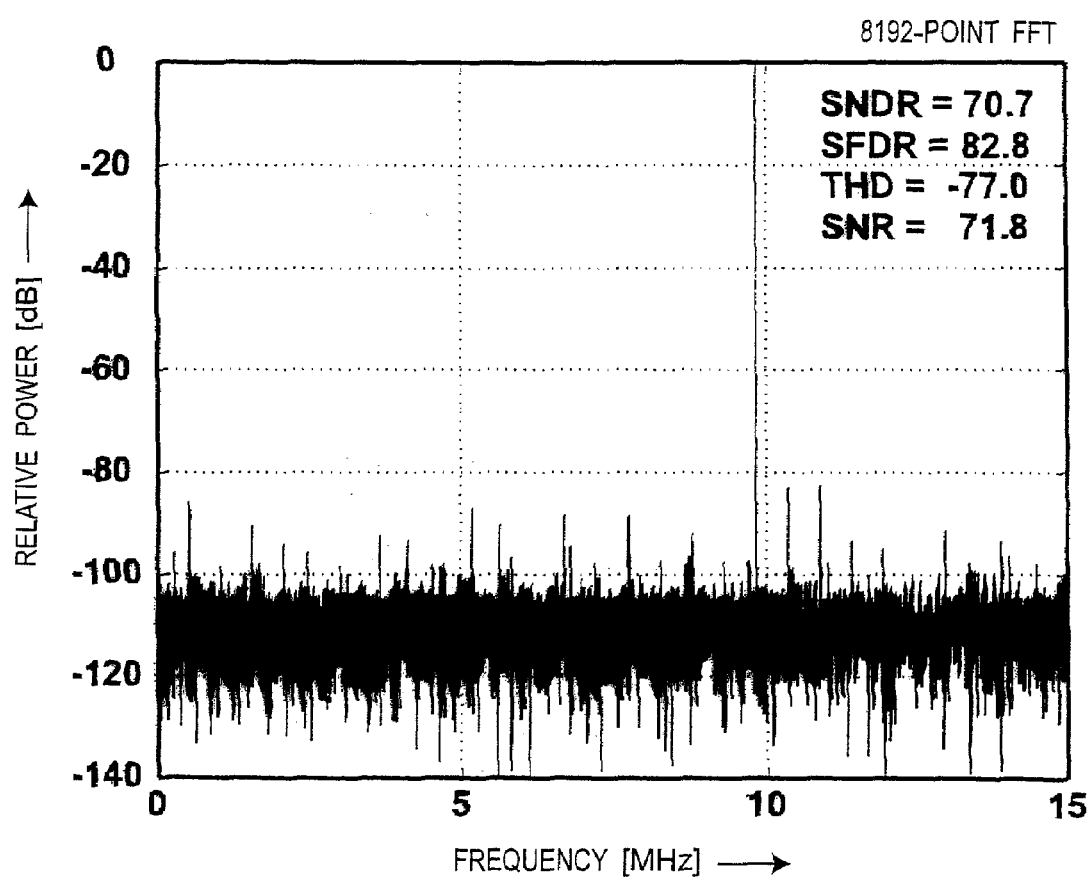
FIG. 19 is a spectrum chart showing results of experiments conducted by the inventors according to the implemental example of FIG. 17, exhibiting the corrected FFT characteristics of the pipeline A/D converter apparatus of the first preferred embodiment.

FIG. 19 is a spectrum chart showing results of experiments conducted by the inventors according to the implemental example of FIG. 17, exhibiting the digitally corrected FFT characteristics of the pipeline A/D converter apparatus of the first preferred embodiment. The SNDR and SFDR were 70.7 dB and 82.8 dB, respectively, and the effective resolution was 11.5 bits.

Figure 20:
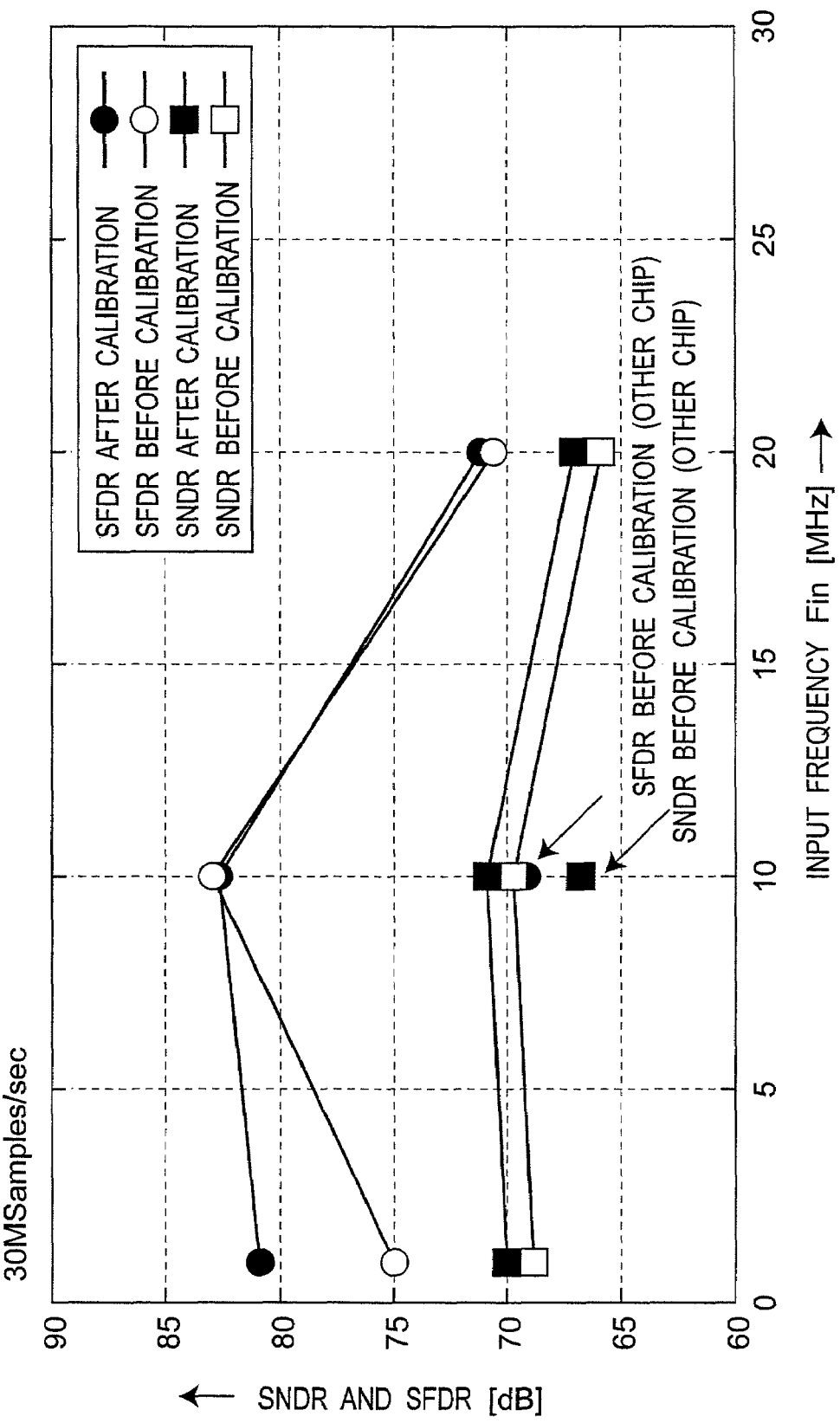
FIG. 20 is a graph showing results of experiments conducted by the inventors according to the implemental example of FIG. 17, exhibiting SNDR (Signal to Noise plus Distortion Power Ratio) and SFDR (Spurious Free Dynamic Range) before and after calibration of the input frequency Fin of the pipeline A/D converter apparatus of the first preferred embodiment.

FIG. 20 is a graph showing results of experiments conducted by the inventors according to the implemental example of FIG. 17, exhibiting SNDR (Signal to Noise plus Distortion Power Ratio) and SFDR (Spurious Free Dynamic Range) before and after calibration of the input frequency Fin of the pipeline A/D converter apparatus of the first preferred embodiment. That is, FIG. 20 exhibits the frequency dependence of SNDR and SFDR with respect to the input frequency when the sampling frequency is set to 30 MHz. When the input frequency is not higher than 10 MHz, an SNDR of not smaller than 70 dB and an SFDR of not smaller than 80 dB were able to be obtained by calibration.

Figure 21:
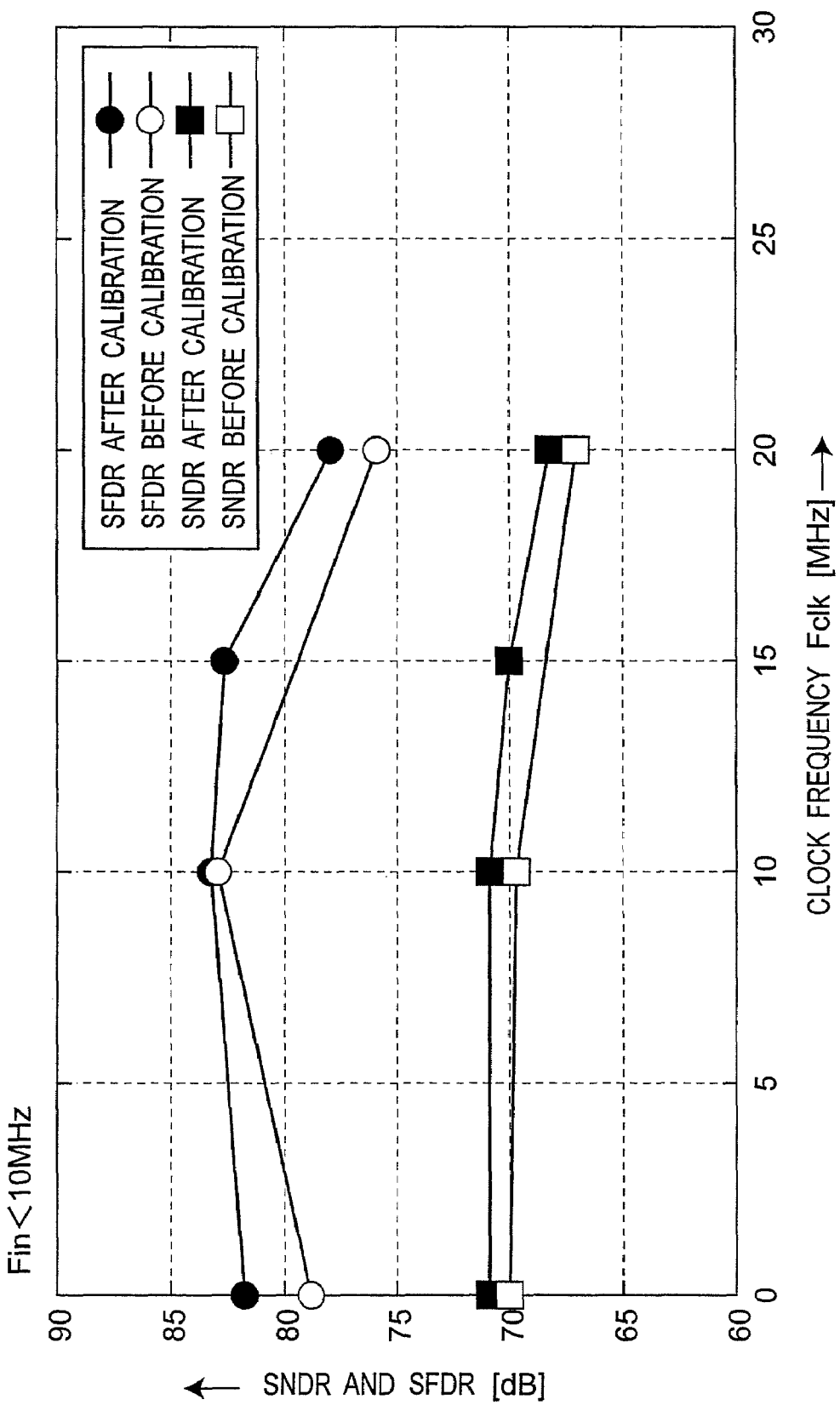
FIG. 21 is a graph showing results of experiments conducted by the inventors according to the implemental example of FIG. 17, exhibiting SNDR (Signal to Noise plus Distortion Power Ratio) and SFDR (Spurious Free Dynamic Range) before and after calibration of the clock frequency Fclk of the pipeline A/D converter apparatus of the first preferred embodiment.

FIG. 21 is a graph showing results of experiments conducted by the inventors according to the implemental example of FIG. 17, exhibiting SNDR (Signal to Noise plus Distortion Power Ratio) and SFDR (Spurious Free Dynamic Range) before and after calibration of the clock frequency Fclk of the pipeline A/D converter apparatus of the first preferred embodiment. That is, FIG. 21 exhibits the frequency dependence of SNDR and SFDR with respect to the sampling frequency when the input frequency is set to 10 MHz. When the sampling frequency is not higher than 35 MHz, an SNDR of not smaller than 70 dB and an SFDR of not smaller than 80 dB were able to be obtained by calibration, and the operation is confirmed up to 40 M Samples/sec. All the measurements are performed by chip-on-board (COB).

FIG. 22 is a table showing results of experiments conducted by the inventors, representing the summary of the performance of the pipeline A/D converter apparatus of the first preferred embodiment. As is apparent from FIG. 22, the total power consumption excluding the digital pad is 102 mW at 30 M Samples/sec. FIG. 23 is a table showing results of experiments conducted by the inventors, representing comparison of the performance of the pipeline A/D converter apparatuses of the prior art documents and the first preferred embodiment. The FOM (Figure of Merit) used in this case is the index of the performance of the Nyquist A/D converter and expressed by the following Equation:

$$FOM = Power / (2^{ENOB} \cdot fs) \quad (17),$$

where fs denotes the sampling frequency, Power denotes the power consumption, and the effective number of bits (ENOB) is obtained from SNDR. The FOM of the A/D converter apparatus made on an experimental basis is 1.17 pJ/conv, and this means that the A/D converter apparatus has lower power consumption on the world's highest level.

As described above, according to the high-resolution pipeline type A/D converter apparatus of the present preferred embodiment, the precharge circuit 30 that precharges the sampling capacitance Cs is provided. Therefore, the transient response of the pipeline stage configured by the switched capacitor circuit is improved so that the settling time is shortened by appropriately charging the sampling capacitance Cs with the predetermined value, and this leads to remarkable reduction in the power consumption of the apparatus.

Second Preferred Embodiment

Figure 25:
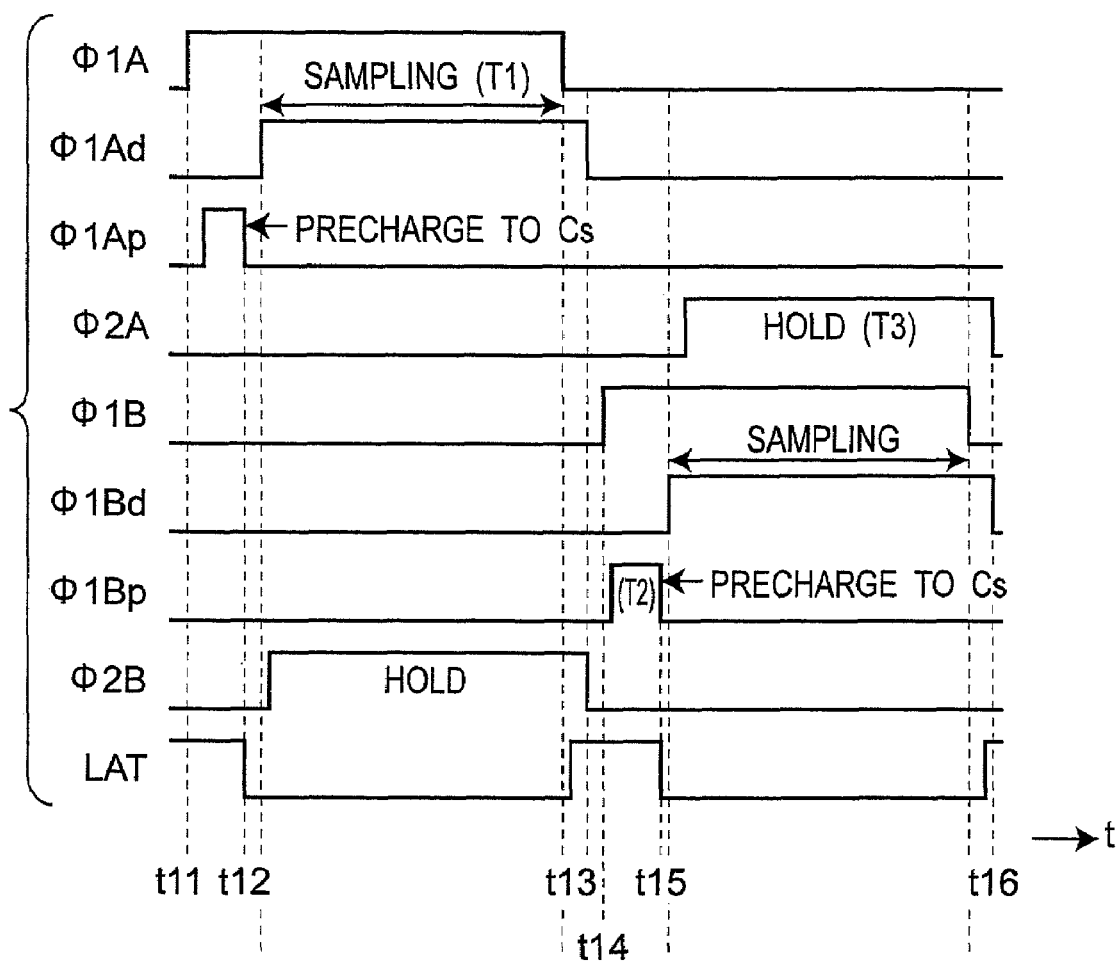
FIG. 25 is a timing chart of the internal clock and timing signals showing operations of the A/D converter circuit parts ADc(i) and ADc(i+1) of FIG. 24.

FIG. 24 is a circuit diagram showing a detailed configuration of A/D converter circuit parts ADc(i) and ADc(i+1) according to the second preferred embodiment of the invention. FIG. 25 is a timing chart of the internal clock and timing signals showing operations of the A/D converter circuit parts ADc(i) and ADc(i+1) of FIG. 24.

In the A/D converter circuit parts ADb(i) and ADb(i+1) of the first preferred embodiment shown in FIG. 17, one operational amplifier Ai is shared by the MDAC circuits of two channels, i.e., an amplifier sharing system is used. In contrast to this, in the A/D converter circuit parts ADc(i) and ADc(i+1) of the second preferred embodiment of FIG. 24, two operational amplifiers Ai and Aia are used by the MDAC circuits of respective channels, i.e., a system of no amplifier sharing is used.

Referring to FIG. 24, the A/D converter circuit part ADc(i) includes the following:

(1) an ADC circuit 31 that subjects input voltages $V_A$in and $V_B$in to A/D conversion by using six comparators 41 to 46;

(2) a first MDAC circuit (upper side in FIG. 24) including a switched capacitor circuit having switches 201 to 209, two capacitors 211 and 212 of the sampling capacitance Cs and an operational amplifier Ai, performs sampling and holding of an input voltage $V_A$in(i) of a first channel and outputs an A/D-converted output voltage $V_A$out(i);

(3) a DAC circuit 22a-1 that outputs the A/D-converted voltage from the preceding stage to the first MDAC circuit;

(4) a PCDAC circuit 32-1 that applies a precharge voltage Vpc to the two capacitors 211 and 212 of the sampling capacitance Cs;

(5) a second MDAC circuit (lower side in FIG. 24) including a switched capacitor circuit having switches 301 to 309, two capacitors 311 and 312 of the sampling capacitance Cs and the other operational amplifier Aia, performs sampling and holding of an input voltage $V_B$in(i) of a second channel and outputs an A/D-converted output voltage $V_B$out(i);

(6) a DAC circuit 22a-2 that outputs the A/D-converted voltage from the preceding stage to the second MDAC circuit; and (7) a PCDAC circuit 32-2 that applies a precharge voltage Vpc to the two capacitors 311 and 312 of the sampling capacitance Cs.

In the A/D converter circuit part ADc(i) configured as above, timing signals applied to the switches 201 to 209 and 301 to 309 are generated in a manner similar to that of FIG. 25 by the internal clock and timing signal generator circuit 15 of FIG. 1. That is, after a timing signal φ1A rises at the time t11, the capacitors 211 and 212 of the sampling capacitance Cs are precharged until the time t12 for the pulse interval of a timing signal φ1Ap. Subsequently, the input voltage Vin(i) is sampled for the interval T1 from the rise time of the timing signal φ1Ad to the fall time of the timing signal φ1A. Then, after a timing signal φ1B rises at the time t14, the capacitors 311 and 312 of the sampling capacitance Cs in the second MDAC circuit are precharged for the interval T2 until the time t15 in response to the pulse of a timing signal φ1Bp. Next, the precharge is held until the time t16 for the pulse interval T3 of a timing signal φ2A. The other timing signals represent the operations carried out concurrently on the background in the other channel.

In the A/D converter circuit parts ADb(i) and ADb(i+1) configured as above, A/D conversion is performed by using the two operational amplifiers Ai and Aia by the MDAC circuits of the respective channels. In this case, the precharge circuit 30 that precharges the sampling capacitance Cs is provided. Therefore, the transient response of the pipeline stage configured by the switched capacitor circuit is improved so that the settling time is shortened by appropriately charging the sampling capacitance Cs with a predetermined value, and this leads to remarkable reduction in the power consumption of the apparatus.

Third Preferred Embodiment

Figure 26:
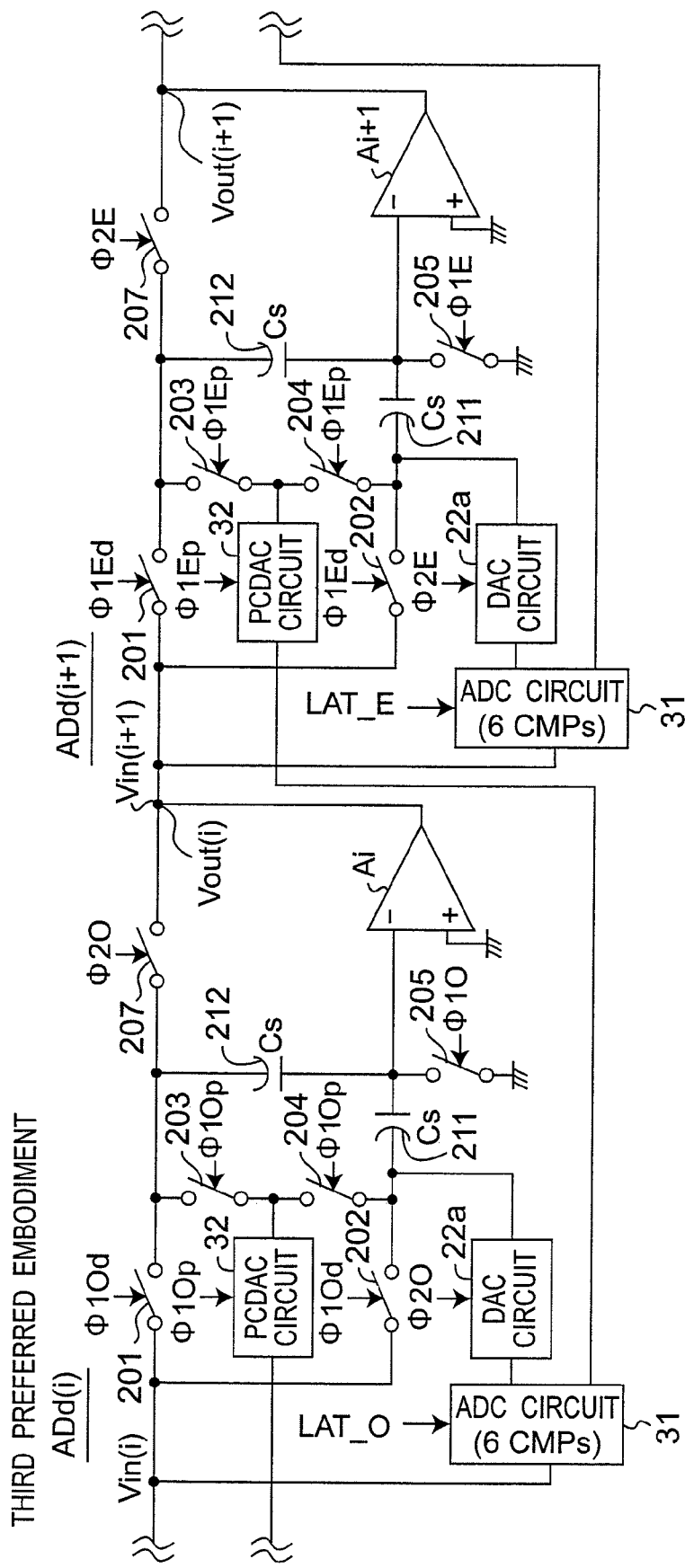
FIG. 26 is a circuit diagram showing a detailed configuration of A/D converter circuit parts ADd(i) and ADd(i+1) according to a third preferred embodiment of the present invention.
Figure 27:
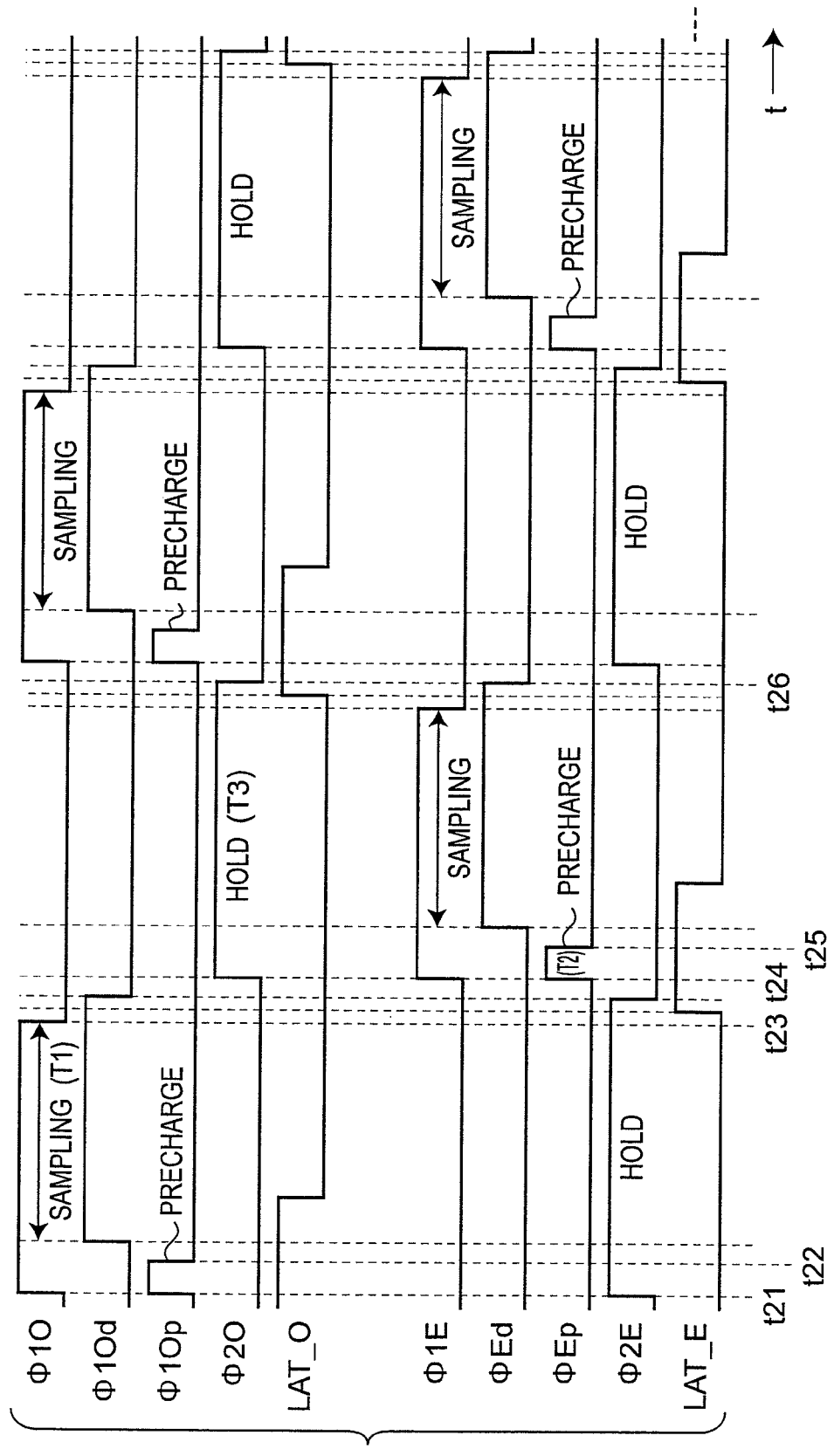
FIG. 27 is a timing chart of the internal clock and timing signals showing operations of the A/D converter circuit parts ADd(i) and ADd(i+1) of FIG. 26.

FIG. 26 is a circuit diagram showing a detailed configuration of A/D converter circuit parts ADd(i) and ADd(i+1) according to the third preferred embodiment of the invention. FIG. 27 is a timing chart of the internal clock and timing signals showing operations of the A/D converter circuit parts ADd(i) and ADd(i+1) of FIG. 26.

Although the first and second preferred embodiments are the A/D converter apparatuses of the two-channel system, the A/D converter circuit parts ADd(i) and ADd(i+1) of the third preferred embodiment are the circuit parts for an A/D converter apparatus of the one-channel system configured by one pair of capacitors 211 and 212 of the sampling capacitance Cs.

Referring to FIG. 26, the A/D converter circuit part ADd(i) includes the following:

(1) an ADC circuit 31 that subjects the input voltage Vin to A/D conversion by using six comparators 41 to 46;

(2) an MDAC circuit including a switched capacitor circuit, which has switches 201 to 203, 205 and 207, two capacitors 211 and 212 of the sampling capacitance Cs, and an operational amplifier Ai, performs sampling and holding of the input voltage Vin(i) and outputs an A/D-converted output voltage Vout(i);

(3) a DAC circuit 22a that outputs the A/D-converted voltage from the preceding stage to the MDAC circuit; and (4) a PCDAC circuit 32 that applies a precharge voltage Vpc to the two capacitors 211 and 212 of the sampling capacitance Cs.

In the A/D converter circuit part ADd(i) configured as above, timing signals applied to the switches 210 to 203, 205 and 207 are generated in a manner similar to that of FIG. 27 by the internal clock and timing signal generator circuit 15 of FIG. 1. It is noted that the symbol O of each timing signal indicates a timing signal for the A/D converter circuit parts ADd(i) of the odd-number stages, and the symbol E of each timing signal indicates a timing signal for the A/D converter circuit parts ADd(i) of the even-number stages. That is, after a timing signal 410 rises at the time t21, the capacitors 211 and 212 of the sampling capacitance Cs are precharged until the time t22 for the pulse interval of a timing signal φ1Op. On the other hand, the input voltage Vin(i) is sampled for the interval T1 from the rise time of a timing signal φ1Od to the fall time (t23) of the timing signal φ1O. Then, after timing signals φ1Ep and 420 rise at the time t24, the capacitors 211 and 212 of the sampling capacitance Cs in the MDAC circuit of the next stage are precharged for the interval T2 until the time t25 in response to the pulse of a timing signal φ1Ep. Next, the precharge is held until the time t26 for the pulse interval T3 of the timing signal 420. The other timing signals represent the operation carried out in the MDAC circuit of the next stage.

In the A/D converter circuit parts ADd(i) and ADd(i+1) configured as above, the input voltage Vin of one channel is subjected to pipeline A/D conversion by alternate operations of the MDAC circuits of the odd-number stages and the even-number stages. In this case, the precharge circuit 30 that precharges the sampling capacitance Cs is provided. Therefore, the transient response of the pipeline stage configured by the switched capacitor circuit is improved so that the settling time is shortened by appropriately charging the sampling capacitance Cs with a predetermined value, and this leads to remarkable reduction in the power consumption of the apparatus.

Fourth Performed Embodiment

Figure 28:
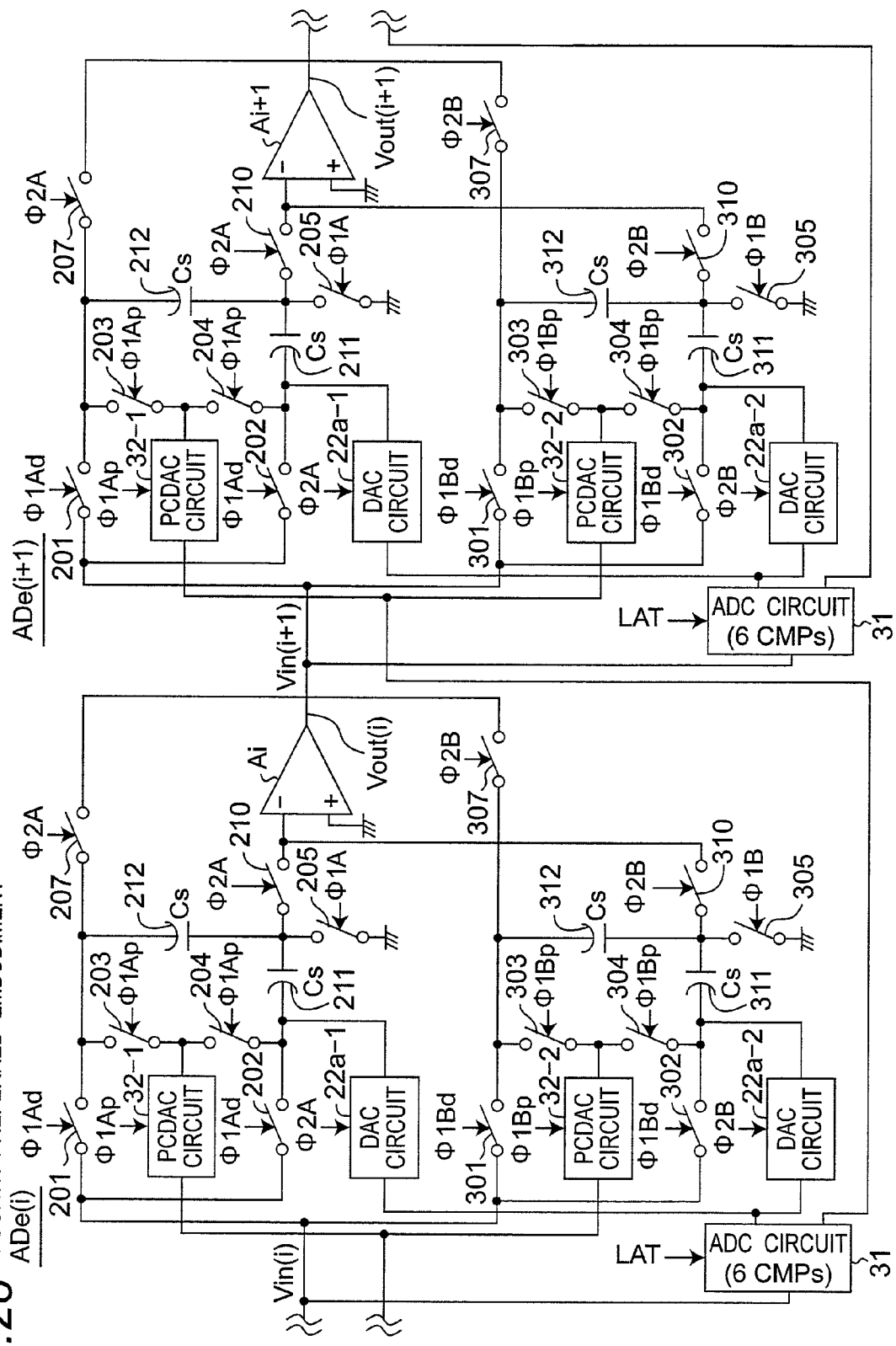
FIG. 28 is a circuit diagram showing a detailed configuration of A/D converter circuit parts ADe(i) and ADe(i+1) according to a fourth preferred embodiment of the present invention.
Figure 29:
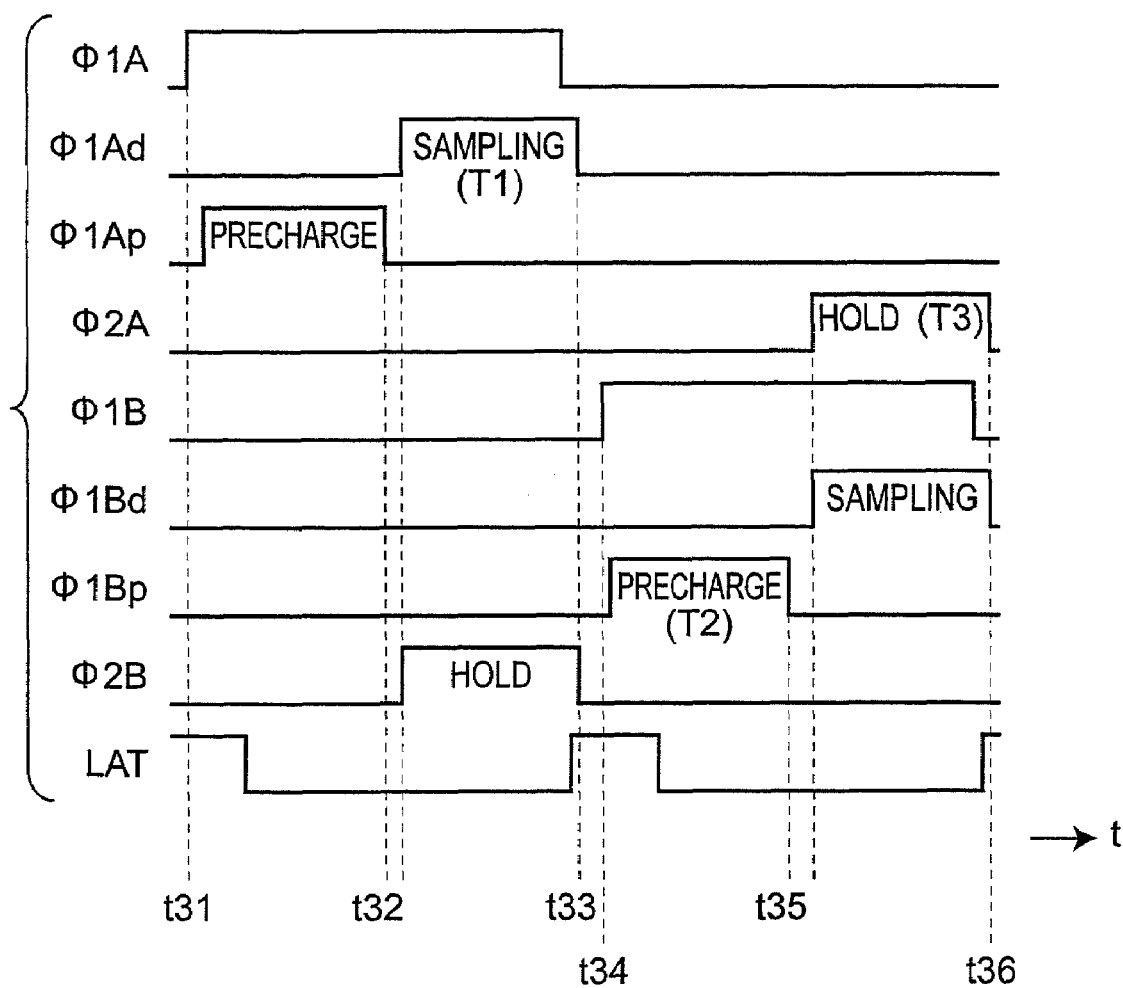
FIG. 29 is a timing chart of the internal clock and timing signals showing operations of the A/D converter circuit parts ADe(i) and ADe(i+1) of FIG. 28.

FIG. 28 is a circuit diagram showing a detailed configuration of A/D converter circuit parts ADe(i) and ADe(i+1) according to the fourth preferred embodiment of the invention. FIG. 29 is a timing chart of the internal clock and timing signals showing operations of the A/D converter circuit parts ADe(i) and ADe(i+1) of FIG. 28.

Although the first and second preferred embodiments are the A/D converter apparatuses of the two-channel system, the A/D converter circuit parts ADe(i) and ADe(i+1) of the fourth preferred embodiment are the circuit parts for an A/D converter apparatus of the one-channel system, in which two pairs of capacitors 211, 212 and 311, 312 of the sampling capacitance Cs are alternately operated and configured by the amplifier sharing system. Referring to FIG. 28, the A/D converter circuit part ADe(i) includes the following:

(1) an ADC circuit 31 that subjects the input voltage Vin to A/D conversion by using six comparators 41 to 46;

(2) a first MDAC circuit (upper side in FIG. 28) including a switched capacitor circuit, which has switches 201 to 210, two capacitors 211 and 212 of the sampling capacitance Cs, and an amplifier-shared operational amplifier Ai, performs sampling and holding of the input voltage Vin(i) and outputs an A/D-converted output voltage Vout(i);

(3) a DAC circuit 22a-1 that outputs the A/D-converted voltage from the preceding stage to the first MDAC circuit;

(4) a PCDAC circuit 32-1 that applies a precharge voltage Vpc to the two capacitors 211 and 212 of the sampling capacitance Cs;

(5) a second MDAC circuit (lower side in FIG. 28) including a switched capacitor circuit, which has switches 301 to 310, two capacitors 311 and 312 of the sampling capacitance Cs, and the operational amplifier Ai, performs sampling and holding of the input voltage Vin(i) and outputs an A/D-converted output voltage Vout(i);

(6) a DAC circuit 22a-2 that outputs the A/D-converted voltage from the preceding stage to the second MDAC circuit; and (7) a PCDAC circuit 32-2 that applies the precharge voltage Vpc to the two capacitors 311 and 312 of the sampling capacitance Cs.

In the A/D converter circuit part ADe(i) configured as above, timing signals applied to the switches 201 to 210 and 301 to 310 are generated in a manner similar to that of FIG. 29 by the internal clock and timing signal generator circuit 15 of FIG. 1. That is, after a timing signal φ1A rises at the time t31, the capacitors 211 and 212 of the sampling capacitance Cs are precharged until the time t32 for the pulse interval of a timing signal φ1Ap. Subsequently, the input voltage Vin(i) is sampled until the time t33 for the interval T1 of the pulse interval of a timing signal φ1Ad. Then, after a timing signal φ1B rises at the time t34, the capacitors 311 and 312 of the sampling capacitance Cs in the second MDAC circuit are precharged for the interval T2 until the time t35 in response to the pulse of a timing signal φ1Bp. Next, the precharge is held until the time t36 for the pulse interval T3 of a timing signal φ2A. The other timing signals represent the operations carried out concurrently on the background in the other channel.

In the A/D converter circuit parts ADe(i) and ADe(i+1) configured as above, pipeline A/D conversion processing is performed by using the amplifier sharing system of the alternate operation of the two pairs of capacitors 211, 212 and 311, 312 by the one-channel system. In this case, the precharge circuit 30 that precharges the sampling capacitance Cs is provided. Therefore, the transient response of the pipeline stage configured by the switched capacitor circuit is improved so that the settling time is shortened by appropriately charging the sampling capacitance Cs with the predetermined value, and this leads to remarkable reduction in the power consumption of the apparatus.

Modified Preferred Embodiments

Figure 30:
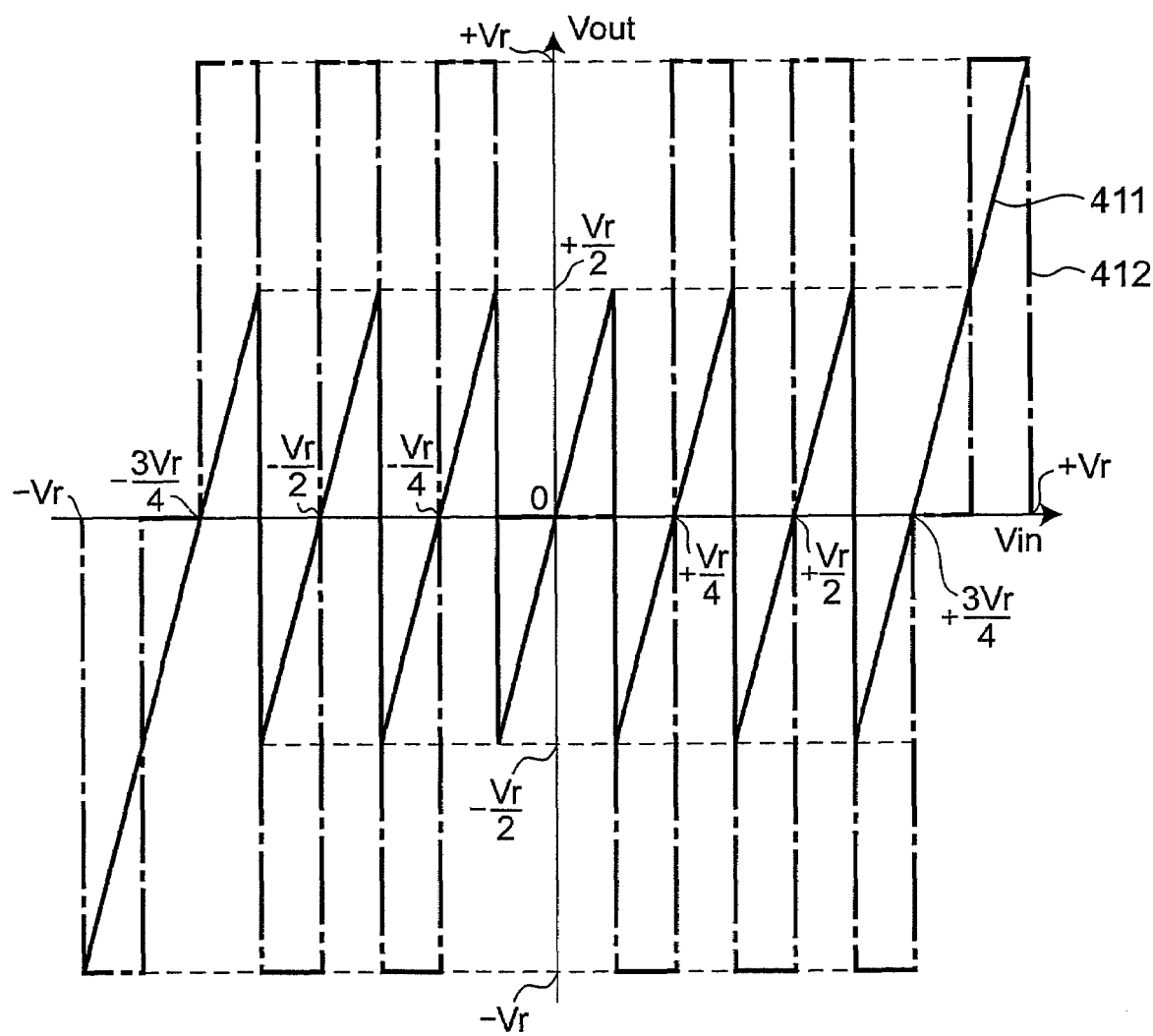
FIG. 30 is a graph showing an analog A/D conversion input to output characteristic 411 and a digital A/D conversion input to output characteristic 412 of an ADC circuit 31A employed in a precharge MDAC circuit (redundant 2 bit (seven values)/stage) according to a modified preferred embodiment.
Figure 31:
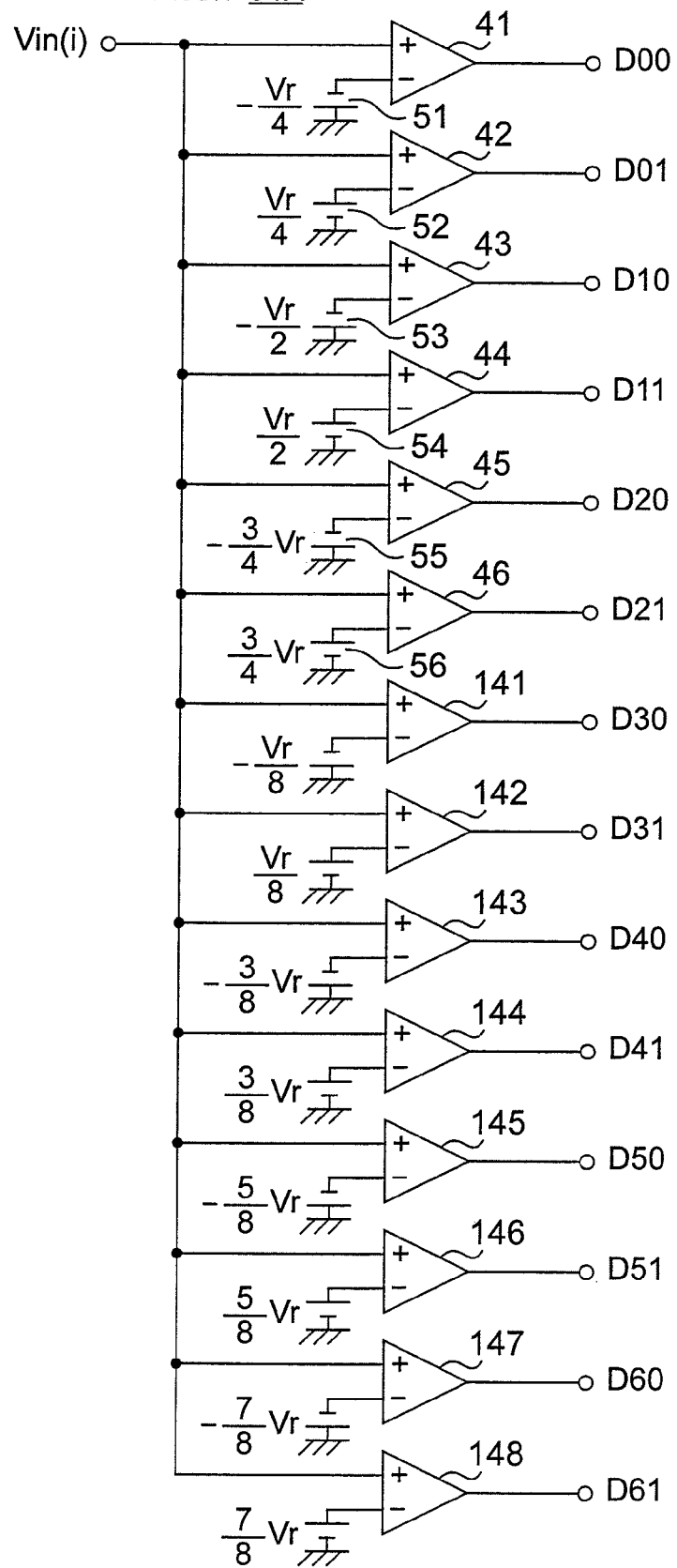
FIG. 31 is a circuit diagram showing a configuration of the ADC circuit 31A employed in the precharge MDAC circuit of FIG. 30.

In each of the above preferred embodiments, the ADC circuit 31 that outputs the output signal of redundant 1.5 bits/stage by using the digital A/D conversion input to output characteristic 402 of FIG. 7. However, the invention is not limited to this, and a characteristic 412 of FIG. 30 may be used in the case of a redundant 2 bits (seven values)/stage system. FIG. 30 is a graph showing an analog A/D conversion input to output characteristic 411 and a digital A/D conversion input to output characteristic 412 in the pre-A/D converter circuit (hereinafter referred to as ADC circuit) 31A employed in a precharge MDAC circuit (redundant 2 bit (seven values)/stage) according to a modified preferred embodiment. FIG. 31 is a circuit diagram showing a configuration of the ADC circuit 31A employed in the precharge MDAC circuit of FIG. 30. The digital A/D conversion input to output characteristic 412 is expressed by the following Equations:

(a) $Vpc=Vr$ for $-Vr \leq Vin < -7Vr/8$, $-5Vr/8 \leq Vin < -Vr/2$, $-3Vr/8 \leq Vin < -Vr/4$, $-Vr/8 \leq Vin < Vr/4$, $3Vr/8 \leq Vin < Vr/2$, or $5Vr/8 \leq Vin < 3Vr/4$;

(b) $Vpc=0$ for $-7Vr/8 \leq Vin < -3Vr/4$, $-Vr/8 \leq Vin < Vr/8$, or $3Vr/4 \leq Vin < 7Vr/8$;

(c) $Vpc=-Vr$ for $-3Vr/4 \leq Vin < -5Vr/8$, $-Vr/2 \leq Vin < -3Vr/8$, $-Vr/4 \leq Vin < -Vr/8$, $Vr/4 \leq Vin < 3Vr/8$, $Vr/2 \leq Vin < 5Vr/8$, or $7Vr/8 \leq Vin < Vr$ (18).

As is apparent from FIG. 30 and Equation (18), the digital D/A conversion input to output characteristic (alternate long and short dash line) 412 (redundant 2 bit (seven values)/stage) in the ADC circuit 31 employed in the precharge type MDAC circuit 40 of the modified preferred embodiment is set to substantially conform to the analog D/A conversion input to output characteristic (solid line) 411 so as to output the three-value output signals of −Vr, 0 and +Vr by using fourteen threshold values of −7Vr/8, −3Vr/4, −5Vr/8, −Vr/2, −3Vr/8, −Vr/4, −Vr/8, +Vr/8, +Vr/4, +3Vr/8, +Vr/2, +5Vr/8, +3Vr/4 and +7Vr/8 corresponding to comparators 41 to 46 and 141 to 148 of FIG. 31 (it is noted that the voltage range of the input signal is predetermined in the actual A/D conversion operation, and neither −Vr nor +Vr is necessary as a threshold value). By using the digital D/A conversion input to output characteristic (alternate long and short dash line) 412, A/D conversion processing of more values and higher accuracy than those of the above preferred embodiments can be achieved.

INDUSTRIAL APPLICABILITY

As described in detail above, according to the pipeline type A/D converter apparatus of the invention, the precharge circuit is provided that precharges the sampling capacitors before sampling so as to attain the predetermined output values in accordance with the digital input to output characteristics substantially adapted to the input to output characteristics of the A/D converter circuit parts that present output signals corresponding to the input signals to the A/D converter circuit parts. Therefore, the pipeline type A/D converter apparatus can be provided which is capable of remarkably reducing the power consumption or increasing the operating speed of the apparatus without increasing the power consumption as compared with the prior art techniques.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A pipeline type A/D converter apparatus comprising:
   a sample holding circuit for sampling and holding an analog input signal, and outputting a sample hold signal; and
   an A/D converter device including a plurality of A/D converter circuit parts connected in cascade with each other, the A/D converter device A/D converting the sample hold signal in a pipeline form,
   wherein each of the A/D converter circuit parts comprises:
   a pre-A/D converter circuit including a plurality of comparators, the pre-A/D converter circuit A/D converting the input signal into a digital signal; and
   a multiplying D/A converter circuit for D/A converting the digital signal from the pre-A/D converter circuit into an analog control signal, and D/A converting the input signal by sampling, holding and amplifying the input signal using a sampling capacitor based on the analog control signal, and
   wherein the pipeline type A/D converter apparatus comprises a precharge circuit for precharges the sampling capacitor before sampling so as to attain a predetermined output value in accordance with a digital input to output characteristic substantially adapted to an input to output characteristic of each of the A/D converter circuit part that presents an output signal corresponding to the input signal to each of the A/D converter circuit parts.

2. The pipeline type A/D converter apparatus as claimed in claim 1,
   wherein the pre-A/D converter circuit of each of the A/D converter circuit parts comprises:
   six comparators having threshold values different from each other, each comparator comparing the input signal with the threshold value and outputting a comparison result signal; and
   a logic circuit for outputting a three-value output signal based on each of the comparison result signals from the six comparators.

3. The pipeline type A/D converter apparatus as claimed in claim 2,
   wherein the comparators have threshold values of −3Vr/4, −Vr/2, −Vr/4, +Vr/4, +Vr/2 and +3Vr/4, respectively, where Vr denotes an A/D conversion reference value of each of the A/D converter circuit parts, and
   wherein the logic circuit outputs an output signal having three values of −Vr, 0 and +Vr based on the comparison result signals from the six comparators.

4. The pipeline type A/D converter apparatus as claimed in claim 1,
   wherein the pre-A/D converter circuit of each of the A/D converter circuit parts comprises:
   fourteen comparators having threshold values different from each other, each comparator comparing the input signal with the threshold value and outputting a comparison result signal; and
   a logic circuit for outputting a three-value output signal based on each of the comparison result signals from the fourteen comparators.

5. The pipeline type A/D converter apparatus as claimed in claim 4,
   wherein the comparators have threshold values of −7Vr/8, −3Vr/4, −5Vr/8, −Vr/2, −3Vr/8, −Vr/4, −Vr/8, +Vr/8, +Vr/4, +3Vr/8, +Vr/2, +5Vr/8, +3Vr/4 and +7Vr/8, respectively, where Vr denotes an A/D conversion reference value of each of the A/D converter circuit parts, and wherein the logic circuit outputs an output signal having three values of −Vr, 0 and +Vr based on the comparison result signals from the fourteen comparators.

6. The pipeline type A/D converter apparatus as claimed in claim 1, wherein each of the A/D converter circuit parts comprises:
the pre-A/D converter circuit; and
first and second multiplying D/A converter circuits each having a configuration of the multiplying D/A converter circuit, and
wherein the pipeline type A/D converter apparatus further comprises a controller for controlling the plurality of A/D converter circuit parts connected in cascade with each other so as to control the first multiplying D/A converter circuit of each of A/D converter circuit parts of odd-number stages to execute processing of precharging, sampling and holding, so as to control the second multiplying D/A converter circuit of each of the A/D converter circuit parts of the odd-number stages to execute amplification processing, so as to control the first multiplying D/A converter circuit of each of A/D converter circuit parts of even-number stages to execute amplification processing, and so as to control the second multiplying D/A converter circuit of each of the A/D converter circuit parts of the even-number stages to execute processing of precharging, sampling and holding.

7. The pipeline type A/D converter apparatus as claimed in claim 6, wherein, in each of the A/D converter circuit parts, one amplifier is shared by an amplifier for performing amplification processing by the first multiplying D/A converter circuit and an amplifier for performing amplification processing by the second multiplying D/A converter circuit.

8. The pipeline type A/D converter apparatus as claimed in claim 1, wherein the A/D converter device comprises:
a first pipeline A/D converter circuit group including a plurality of A/D converter circuit parts connected in cascade with each other; and
a second pipeline A/D converter circuit group including a plurality of A/D converter circuit parts connected in cascade with each other, and
wherein the A/D converter device A/D converts the sample hold signals of two systems using the first and second pipeline A/D converter circuit groups in a pipeline form.

* * * * *